United States Patent
Lo et al.

(10) Patent No.: US 12,295,137 B2
(45) Date of Patent: May 6, 2025

(54) METHOD OF MANUFACTURING TSEMICONDUCTOR DEVICE HAVING BONDING STRUCTURE

(71) Applicant: NANYA TECHNOLOGY CORPORATION, New Taipei (TW)

(72) Inventors: Yi-Jen Lo, New Taipei (TW); Chiang-Lin Shih, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 207 days.

(21) Appl. No.: 18/213,977

(22) Filed: Jun. 26, 2023

(65) Prior Publication Data
US 2024/0074147 A1    Feb. 29, 2024

Related U.S. Application Data

(62) Division of application No. 17/896,933, filed on Aug. 26, 2022.

(51) Int. Cl.
| | | |
|---|---|---|
| *H10B 12/00* | (2023.01) | |
| *H01L 23/528* | (2006.01) | |
| *H01L 23/532* | (2006.01) | |

(52) U.S. Cl.
CPC ....... *H10B 12/315* (2023.02); *H01L 23/5283* (2013.01); *H01L 23/53295* (2013.01); *H10B 12/0335* (2023.02); *H10B 12/482* (2023.02); *H10B 12/488* (2023.02)

(58) Field of Classification Search
None
See application file for complete search history.

(56) References Cited

U.S. PATENT DOCUMENTS

| | | | | |
|---|---|---|---|---|
| 11,037,878 | B1* | 6/2021 | Yeh | H01L 23/481 |
| 11,963,352 | B2* | 4/2024 | Rabkin | H01L 24/08 |
| 2021/0167113 | A1 | 6/2021 | Ryoki et al. | |
| 2022/0028882 | A1 | 1/2022 | Lee | |
| 2022/0068966 | A1 | 3/2022 | Rabkin et al. | |
| 2022/0254803 | A1 | 8/2022 | Shen | |
| 2022/0285434 | A1* | 9/2022 | Shen | H10N 50/10 |

(Continued)

FOREIGN PATENT DOCUMENTS

| | | |
|---|---|---|
| TW | 201834221 A | 9/2018 |
| TW | 201935642 A | 9/2019 |
| TW | 202013685 A | 4/2020 |

(Continued)

OTHER PUBLICATIONS

Office Action and and the search report mailed on Mar. 12, 2024 related to Taiwanese Application No. 112146865.

(Continued)

*Primary Examiner* — Steven M Page
(74) *Attorney, Agent, or Firm* — Xuan Zhang

(57) ABSTRACT

A semiconductor device and method for manufacturing the same are provided. The semiconductor device includes a substrate, a bonding structure, a bit line, and a word line. The bonding structure is disposed on the substrate. The bit line is disposed on the bonding structure. The channel layer is disposed on the bit line. The word line surrounds the channel layer. The bonding structure includes a dielectric material.

13 Claims, 23 Drawing Sheets

(56) References Cited

U.S. PATENT DOCUMENTS

2023/0066312 A1* 3/2023 Zhu .................. H10B 41/27
2024/0324169 A1* 9/2024 Sumi ................. H10B 12/488

FOREIGN PATENT DOCUMENTS

| TW | 202119592 A | 5/2021 |
| TW | 202125775 A | 7/2021 |
| TW | 202133324 A | 9/2021 |

OTHER PUBLICATIONS

Office Action and and the search report mailed on Nov. 7, 2023 related to Taiwanese Application No. 112112335.

* cited by examiner

METHOD OF MANUFACTURING TSEMICONDUCTOR DEVICE HAVING BONDING STRUCTURE

CROSS-REFERENCE TO RELATED APPLICATION

This application is a divisional application of U.S. Non-Provisional application Ser. No. 17/896,933 filed 26 Aug. 2022, which is incorporated herein by reference in its entirety.

TECHNICAL FIELD

The present disclosure relates to a semiconductor device and method of manufacturing the same, and in particularly to a semiconductor device including a bonding structure.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a bonding structure, a bit line, and a word line. The bonding structure is disposed on the substrate. The bit line is disposed on the bonding structure. The channel layer is disposed on the bit line. The word line surrounds the channel layer. The bonding structure comprises a dielectric material.

Another aspect of the present disclosure provides a method for manufacturing a semiconductor device. The method includes providing a first substrate and forming a first dielectric layer on the first substrate. The method also includes providing a second substrate, the second substrate including a metallization layer over the second substrate. The method further includes forming a second dielectric layer over the metallization layer. In addition, the method includes bonding the first dielectric layer and the second dielectric layer to form a bonding structure between the first substrate and the second substrate. The method also includes pattering the second substrate to form a stack structure over the bonding structure. The method further includes patterning the metallization layer to form a bit line over the bonding structure and forming a word line on a lateral surface of the stack structure.

Another aspect of the present disclosure provides a method for manufacturing a semiconductor device. The method includes providing a first substrate and forming a conductive feature over the first substrate. The method also includes forming a first dielectric layer on the conductive feature. The method further includes providing a second substrate. The second substrate includes a support part and a transfer part. In addition, the method includes forming a metallization layer on the transfer part of the second substrate and forming a second dielectric layer on the metallization layer. The method also includes bonding the first dielectric layer and the second dielectric layer and removing the support part of the second substrate. The method further includes patterning the transfer part of the second substrate to form a channel layer. Moreover, the method also includes patterning the metallization layer to form a bit line and forming a word line surrounding the channel layer.

The embodiments of the present disclosure provide a semiconductor device and method of manufacturing the same. During bonding of two substrates, a fusion bonding technique is utilized. Fusion bonding technique involves bonding two dielectric layers formed on two individual substrates. In a comparative example, two substrates are bonded through a bonding of metal to metal, resulting in voids formed at an interface between metal layers. Such voids may make a bit line, formed by patterning the metal layers, unstable, incurring a low yield. In the embodiments of the present disclosure, voids are formed at an interface between bonded dielectric layers. The void in the dielectric layer has a relatively dimension. Further, the bit lines of the present disclosure are free of voids, enhancing the yield in comparison with comparative examples.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
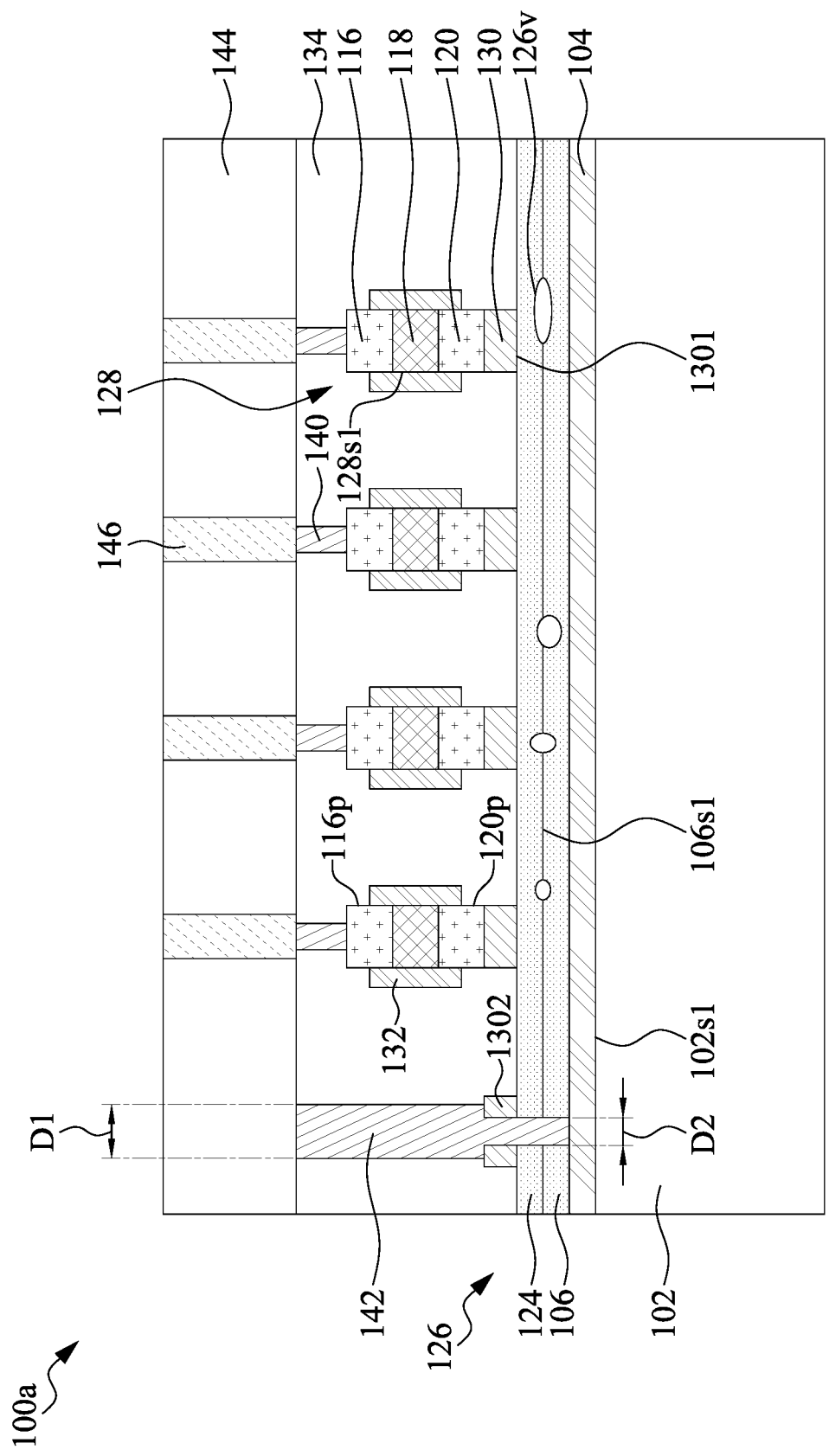
FIG. 1 is a cross-sectional view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a cross-sectional view of a semiconductor device 100a, in accordance with some embodiments of the present disclosure. In some embodiments, the semiconductor device 100a may be applicable to a memory device, such as a dynamic random access memory (DRAM) device, a one-time programming (OTP) memory device, a static random access memory (SRAM) device, or other suitable memory devices.

During read operation, a word line can be asserted, turning on the transistor. The enabled transistor allows the voltage across the capacitor to be read by a sense amplifier through a bit line. During a write operation, the data to be written can be provided on the bit line when the word line is asserted.

In some embodiments, the semiconductor device 100a may include a substrate 102, a conductive feature 104, a bonding structure 126, a stack structure 128, a conductive line 130, a word line 132, a dielectric structure 134, a dielectric structure 144, and a capacitor 146.

The substrate 102 may be a semiconductor substrate, such as a bulk semiconductor, a semiconductor-on-insulator (SOI) substrate, or the like. The substrate 102 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 102 may have a multilayer structure, or the substrate 102 may include a multilayer compound semiconductor structure.

The substrate 102 may have multiple doped regions (not shown) therein. In some embodiments, p type and/or n type dopants may be doped in the substrate 102. In some embodiments, p type dopants include boron (B), other group III elements, or any combination thereof. In some embodiments, n type dopants include arsenic (As), phosphorus (P), other group V elements, or any combination thereof.

Although not shown, it should be noted that some components, such as transistors, conductive traces, and/or other elements, may be formed within the substrate 102.

In some embodiments, the conductive feature 104 may be disposed on a surface $102s1$ of the substrate 102. The conductive feature 104 may be electrically connected to the transistors formed within the substrate 102. The conductive feature 104 may include copper (Cu), tungsten (W), aluminum (Al), tantalum (Ta), molybdenum (Mo), tantalum nitride (TaN), titanium, titanium nitride (TiN), the like, and/or a combination thereof.

In some embodiments, the bonding structure 126 may be disposed on the conductive feature 104. In some embodiments, the bonding structure 126 may include a dielectric material. In some embodiments, the bonding structure 126 may include a dielectric layer 106 and a dielectric layer 124 disposed over the dielectric layer 106. In some embodiments, each of the dielectric layer 106 and dielectric layer 124 may include silicon oxide ($SiO_x$), silicon nitride ($Si_xN_y$), silicon oxynitride (SiON), or a combination thereof.

In some embodiments, a plurality of voids $126v$ may be located at an interface $106s1$ between the dielectric layer 106 and the dielectric layer 124. The plurality of voids $126v$ may have different sizes. In some embodiments, the void $126v$ may include, for example, air or other suitable gases, such as argon or nitrogen.

In some embodiments, the dielectric structure 134 may be formed on the bonding structure 126. The dielectric structure 134 may include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the dielectric structure 134 may be a multilayered structure and may include multiple layers of different materials.

In some embodiments, the conductive line 130 may be disposed on the bonding structure 126. The conductive line 130 may be in contact with the dielectric layer 124. In some embodiments, the conductive line 130 may be spaced apart from the conductive feature 104 by the bonding structure 126. In some embodiments, the conductive line 130 may be embedded in the dielectric structure 134. The conductive line 130 may include conductive materials, such as tungsten, copper, aluminum, tantalum, tantalum nitride, titanium, titanium nitride, the like, and/or a combination thereof. The conductive line 130 may include bit lines 1301 and 1302. Each of the bit lines 1301 may be connected to the stack structure 128. The bit line 1302 may be spaced apart from the bit line 1301. The bit line 1302 may be spaced apart from the stack structure 128.

In some embodiments, the stack structure 128 may be disposed on the conductive line 130. In some embodiments, the stack structure 128 may be disposed on the bit line 1301. In some embodiments, the stack structure 128 may be embedded in the dielectric structure 134. In some embodiments, the stack structure 128 may include a semiconductor material, such as silicon, germanium, tin, antimony or a combination thereof. In some embodiments, the stack structure 128 may be configured to transmit carriers, such as electrons and/or holes. The stack structure 128 may serve as a channel layer.

In some embodiments, the stack structure 128 may include a doped region 116, a doped region 118, and a doped region 120. In some embodiments, the doped region 120 may be disposed on the conductive line 130. In some embodiments, the doped region 120 may be in contact with the conductive line 130. In some embodiments, the doped region 120 may have a first conductive type. In some embodiments, the first conductive type may be an n type or a p type. In some embodiments, n type dopants, such as arsenic (As), phosphorus (P), other group V elements, or any combination thereof, may be doped in the doped region 120. In some embodiments, p type dopants, such as boron (B), other group III elements, or any combination thereof, may be doped in the doped region 120.

In some embodiments, the doped region 118 may be disposed on the doped region 120. In some embodiments, the doped region 118 may be disposed between the doped region 116 and the doped region 120. In some embodiments, the doped region 118 may be in contact with the doped region 120. In some embodiments, the doped region 118 may have a second conductive type different from the first conductive type.

In some embodiments, the doped region 116 may be disposed on the doped region 118. In some embodiments, the doped region 116 may be in contact with the doped region 118. In some embodiments, the doped region 116 may have the first conductive type.

In other embodiments, the stack structure 128 may include metal oxide. The metal oxide may include, but is not limited to, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—S based oxide (also represented as ITO), an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, but the present disclosure is not limited in this regard.

In some embodiments, the word line 132 may be disposed on a lateral surface 128$s1$ of the stack structure 128. In some embodiments, the word line 132 may be embedded in the dielectric structure 134. In some embodiments, the word line 132 may surround the stack structure 128. In some embodiments, the word line 132 may enclose the stack structure 128. In some embodiments, the word line 132 may have a ring-shape profile from a top view. In some embodiments, the word line 132 may cover a portion of the lateral surface 128$s1$ of the stack structure 128. In some embodiments, a portion 120$p$ of the doped region 120 may be exposed by the word line 132. In some embodiments, a portion 116$p$ of the doped region 116 may be exposed by the word line 132. In some embodiments, the doped region 118 may be completely covered by the stack structure 128. In some embodiments, the lateral surface (not annotated in the figures) of the doped region 118 may be completely covered by the word line 132. In some embodiments, the word line 132 may include a circular, oval, elliptical, or other profile. The word line 132 may include conductive materials, such as tungsten, copper, aluminum, tantalum, tantalum nitride, titanium, titanium nitride, the like, and/or a combination thereof.

Although not shown in FIG. 1, it should be noted that a gate dielectric layer may be disposed between the stack structure 128 and the word line 132. The gate dielectric layer may include silicon oxide ($SiO_x$), silicon nitride ($Si_xN_y$), silicon oxynitride (SiON), or a combination thereof. In some embodiments, the gate dielectric layer may include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

In some embodiments, the dielectric structure 144 may be disposed on the dielectric structure 134. In some embodiments, the dielectric structure 144 may include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the dielectric structure 144 may be a multilayered structure and may include multiple layers of different materials.

In some embodiments, the capacitor 146 may be disposed on the dielectric structure 134. In some embodiments, the capacitor 146 may be electrically connected to the conductive line 130. In some embodiments, the capacitor 146 may be electrically connected to the stack structure 128. In some embodiments, the capacitor 146 may include a first electrode, a capacitor dielectric, and a second electrode (not annotated in the figures). In some embodiments, the capacitor dielectric may be disposed between the first electrode and the second electrode.

The first electrode and/or second electrode may include a semiconductor material or a conductive material. The semiconductor material may include polysilicon or other suitable materials. The conductive material may include tungsten, copper, aluminum, tantalum, or other suitable materials.

The capacitor dielectric may include dielectric materials, such as silicon oxide, tungsten oxide, zirconium oxide, copper oxide, aluminum oxide, hafnium oxide, or the like.

In some embodiments, the semiconductor device 100$a$ may further include a conductive plug 140. In some embodiments, the conductive plug 140 may be disposed between the stack structure 128 and the capacitor 146. In some embodiments, the conductive plug 140 may be embedded in the dielectric structure 134. The conductive plug 140 may include conductive materials, such as tungsten, copper, aluminum, tantalum, tantalum nitride, titanium, titanium nitride, the like, and/or a combination thereof.

In some embodiments, the semiconductor device 100$a$ may further include a conductive plug 142. In some embodiments, the conductive plug 142 may be embedded in the dielectric structure 134. In some embodiments, the conductive plug 142 may penetrate the dielectric structure 134. In some embodiments, the conductive plug 142 may penetrate the bit line 1302. In some embodiments, the conductive plug 142 may penetrate the bonding structure 126. In some embodiments, the conductive plug 142 may penetrate the dielectric layer 124. In some embodiments, the conductive plug 142 may penetrate the dielectric layer 106. In some embodiments, the conductive plug 142 may be in contact with the conductive feature 104. In some embodiments, the conductive plug 142 may be electrically connected to the conductive feature 104. In some embodiments, the conductive feature 104 may have a dimension D1 and a dimension D2 different from the dimension D1. The dimension D2 may be less than the dimension D1. The conductive plug 142 surrounded by the dielectric structure 134 may have the dimension D1. The conductive plug 142 surrounded by the bonding structure 126 may have the dimension D2. The conductive plug 142 may include conductive materials, such as tungsten, copper, aluminum, tantalum, tantalum nitride, titanium, titanium nitride, the like, and/or a combination thereof.

In this embodiment, the bonding structure 126 may be configured to bond the substrate 102 and another substrate, which may be patterned to form the stack structures 128. The bonding structure 126 may be formed by a fusion bonding technique, resulting in voids 126$v$ formed during fusion bonding technique. In a comparative example, two substrates are bonded through bonding two metal layers, and voids may be formed at an interface between the metal layers. The voids in the metal layer may have a relatively large size, which may cause the bit line to be prone to collapse. The voids 126$v$ in the bonding structure 126 has a relatively small size. The conductive line 130 is free of voids. Therefore, the performance of the semiconductor device 100$a$ may be enhanced.

Figure 2:
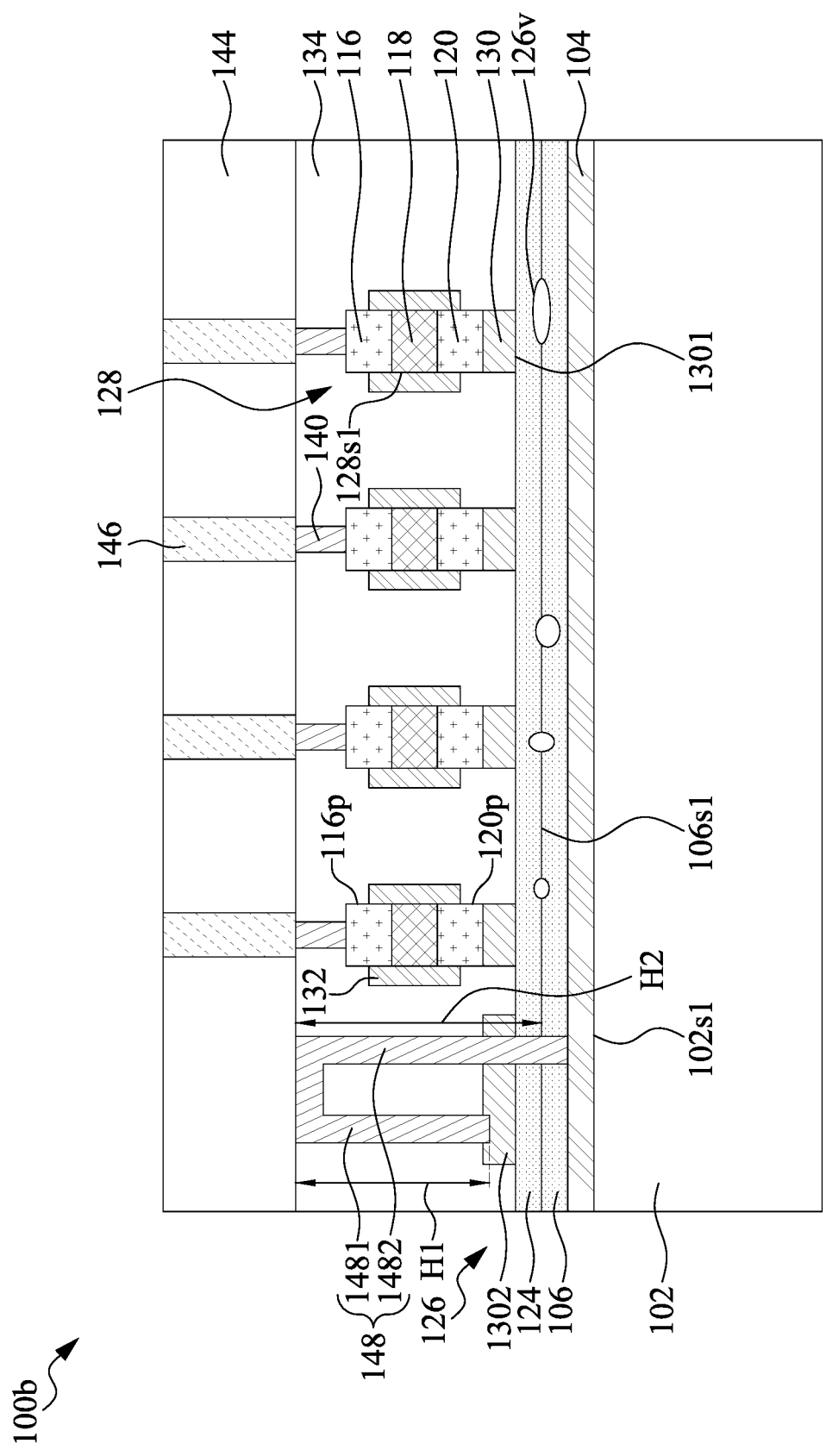
FIG. 2 is a cross-sectional view of a semiconductor device, in accordance with some embodiments of the present disclosure.

FIG. 2 is a cross-sectional view of a semiconductor device 100$b$, in accordance with some embodiments of the present disclosure. The semiconductor device 100$b$ is similar to the semiconductor device 100$a$ as shown in FIG. 1, with differences there between as follows.

In some embodiments, the semiconductor device 100$b$ may include a conductive plug 148. The conductive plug 148 may penetrate the dielectric structure 134. In some embodiments, the conductive plug 148 may include a portion 1481 and a portion 1482. In some embodiments, the portion 1481 may penetrate a portion of the bit line 1302. In some embodiments, the portion 1481 may be spaced apart from the conductive feature 104 by the bonding structure 126. In some embodiments, the portion 1481 may be spaced apart from the conductive feature 104 by the bit line 1302.

In some embodiments, the portion 1482 may penetrate the bit line 1302. In some embodiments, the portion 1482 may penetrate the bonding structure 126. In some embodiments, the portion 1482 may penetrate the dielectric layer 124. In some embodiments, the portion 1482 may penetrate the dielectric layer 106. In some embodiments, the portion 1482 may be in contact with the conductive feature 104. The portion 1481 may have a height H1. The portion 1482 may have a height H2. In some embodiments, the height H1 of the portion 1481 may be different from the height H2 of the portion 1482. In some embodiments, the height H2 of the portion 1482 may be greater than the height H1 of the portion 1481.

Figure 3:
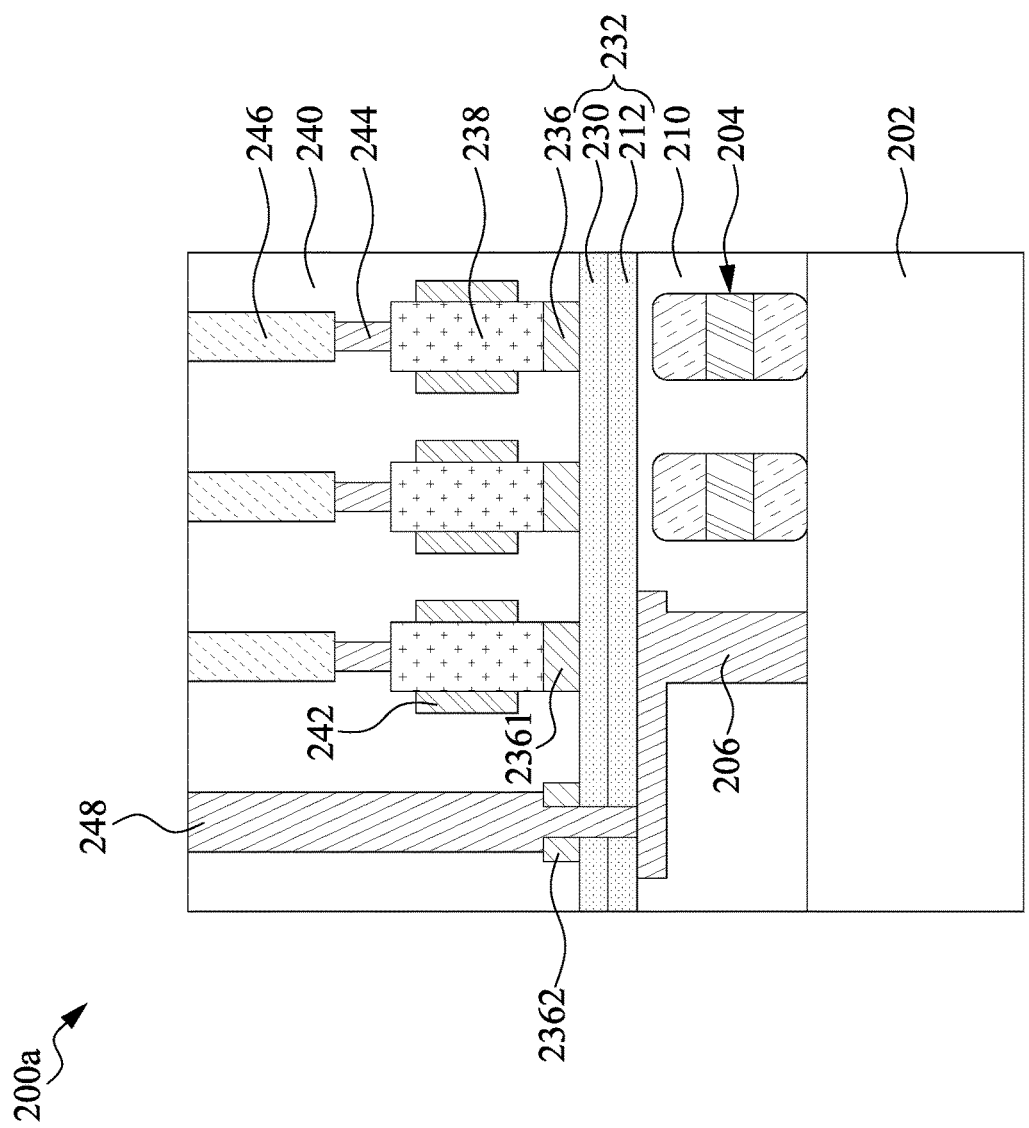
FIG. 3 is a cross-sectional view of a semiconductor device, in accordance with some embodiments of the present disclosure.

FIG. 3 is a cross-sectional view of a semiconductor device 200a, in accordance with some embodiments of the present disclosure. In some embodiments, the semiconductor device 200a may be applicable to a memory device, such as a dynamic random access memory device, a one-time programming memory device, a static random access memory device, or other suitable memory devices.

In some embodiments, the semiconductor device 200a may include a substrate 202, a transistor 204, a conductive feature 206, a dielectric structure 210, a bonding structure 232, a conductive line 236, a stack structure 238, a dielectric structure 240, a word line 242, a conductive plug 244, and a capacitor 246.

The substrate 202 may be a semiconductor substrate, such as a bulk semiconductor, a semiconductor-on-insulator substrate, or the like. The substrate 202 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 202 may have a multilayer structure, or the substrate 202 may include a multilayer compound semiconductor structure.

The substrate 202 may have multiple doped regions (not shown) therein. In some embodiments, p type and/or n type dopants may be doped in the substrate 202.

The transistor 204 may be formed on or over the substrate 202. The transistor 204 may be at least partially formed within the conductive feature 206. In some embodiments, the transistor 204 may include metal oxide semiconductor (MOS), such as PMOS, NMOS, and/or CMOS.

In some embodiments, the conductive feature 206 may be disposed on the substrate 102. The conductive feature 206 may penetrate the dielectric structure 210. The conductive feature 206 may include copper, tungsten, aluminum, tantalum, molybdenum, tantalum nitride, titanium, titanium nitride, the like, and/or a combination thereof.

In some embodiments, the bonding structure 232 may be disposed on the conductive feature 206. In some embodiments, the bonding structure 232 may include a dielectric material. In some embodiments, the bonding structure 232 may include a dielectric layer 212 and a dielectric layer 230 disposed over the dielectric layer 212. In some embodiments, each of the dielectric layer 212 and dielectric layer 230 may include silicon oxide ($SiO_x$), silicon nitride ($Si_xN_y$), silicon oxynitride (SiON), or a combination thereof.

In some embodiments, the dielectric structure 240 may be formed on the bonding structure 232. The dielectric structure 240 may include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the dielectric structure 240 may be a multilayered structure and may include multiple layers of different materials.

In some embodiments, the conductive line 236 may be disposed on the bonding structure 232. The conductive line 236 may be in contact with the bonding structure 232. In some embodiments, the conductive line 236 may be spaced apart from the conductive feature 206 by the bonding structure 232. In some embodiments, the conductive line 236 may be embedded in the dielectric structure 240. The conductive line 236 may include conductive materials, such as tungsten, copper, aluminum, tantalum, tantalum nitride, titanium, titanium nitride, the like, and/or a combination thereof. The conductive line 236 may include bit lines 2361 and 2362. The bit line 2361 may be spaced apart from the bit line 2362.

In some embodiments, the stack structure 238 may be disposed on the bonding structure 232. In some embodiments, the stack structure 238 may be embedded in the dielectric structure 240. In some embodiments, the stack structure 238 may include a semiconductor material, such as silicon, germanium, tin, antimony or a combination thereof. In some embodiments, the stack structure 238 may be configured to transmit carriers, such as electrons and/or holes. Although not shown, the stack structure 238 may include one or more doped regions doped with n type and/or p type dopants.

In other embodiments, the stack structure 238 may include metal oxide. The metal oxide may include, but is not limited to, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—S based oxide (also represented as ITO), an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, but the present disclosure is not limited in this regard.

In some embodiments, the word line 242 may be disposed on a lateral surface (not annotated in the figures) of the stack structure 238. In some embodiments, the word line 242 may be embedded in the dielectric structure 240. In some embodiments, the word line 242 may surround the stack structure 238. In some embodiments, the word line 242 may enclose the stack structure 238. In some embodiments, the word line 242 may have a ring-shape profile from a top view. In some embodiments, the word line 242 may cover a portion of the lateral surface of the stack structure 238. In some embodiments, a portion of the lateral surface of the stack structure 238 may be exposed by the word line 242. The word line 242 may include conductive materials, such as tungsten, copper, aluminum, tantalum, tantalum nitride, titanium, titanium nitride, the like, and/or a combination thereof.

Although not shown, it should be noted that a gate dielectric layer may be disposed between the word line 242 and the stack structure 238. The gate dielectric layer may include silicon oxide ($SiO_x$), silicon nitride ($Si_xN_y$), silicon oxynitride (SiON), or a high-k material.

In some embodiments, the capacitor 246 may be disposed on the stack structure 238. In some embodiments, the capacitor 246 may be electrically connected to the conductive line 236. In some embodiments, the capacitor 246 may be electrically connected to the transistor 204.

In some embodiments, the semiconductor device 200a may further include a conductive plug 244. In some embodiments, the conductive plug 244 may be disposed between the stack structure 238 and the capacitor 246. In some embodiments, the conductive plug 244 may be embedded in the dielectric structure 240. The conductive plug 244 may include conductive materials, such as tungsten, copper, aluminum, tantalum, tantalum nitride, titanium, titanium nitride, the like, and/or a combination thereof.

In some embodiments, the semiconductor device 200a may further include a conductive plug 248. In some embodiments, the conductive plug 248 may be embedded in the dielectric structure 240. In some embodiments, the conductive plug 248 may penetrate the dielectric structure 240. In some embodiments, the conductive plug 248 may penetrate the bit line 2362. In some embodiments, the conductive plug 248 may penetrate the bonding structure 232. In some embodiments, the conductive plug 248 may penetrate the dielectric layer 230. In some embodiments, the conductive plug 248 may penetrate the dielectric layer 212. In some embodiments, the conductive plug 248 may be in contact with the conductive feature 206. In some embodiments, the conductive plug 248 may be electrically connected to the conductive feature 206. The conductive plug 248 may include conductive materials, such as tungsten, copper, aluminum, tantalum, tantalum nitride, titanium, titanium nitride, the like, and/or a combination thereof.

In this embodiment, the bonding structure 232 may be configured to bond the substrate 202 and an additional substrate, which may be patterned to form the stack structures 238. The bonding structure 232 may be formed by a fusion bonding technique, resulting in voids formed in the bonding structure 232. In a comparative example, two substrates are bonded through bonding two metal layers. The voids in the metal layers may have a relatively large size, which may cause the bit line to be prone to collapse. The voids in the bonding structure 232 may have a relatively small size. The conductive feature 206 is free of voids. The bit lines 2301 are free of voids. Therefore, the performance of the semiconductor device 200a may be enhanced.

Figure 4:
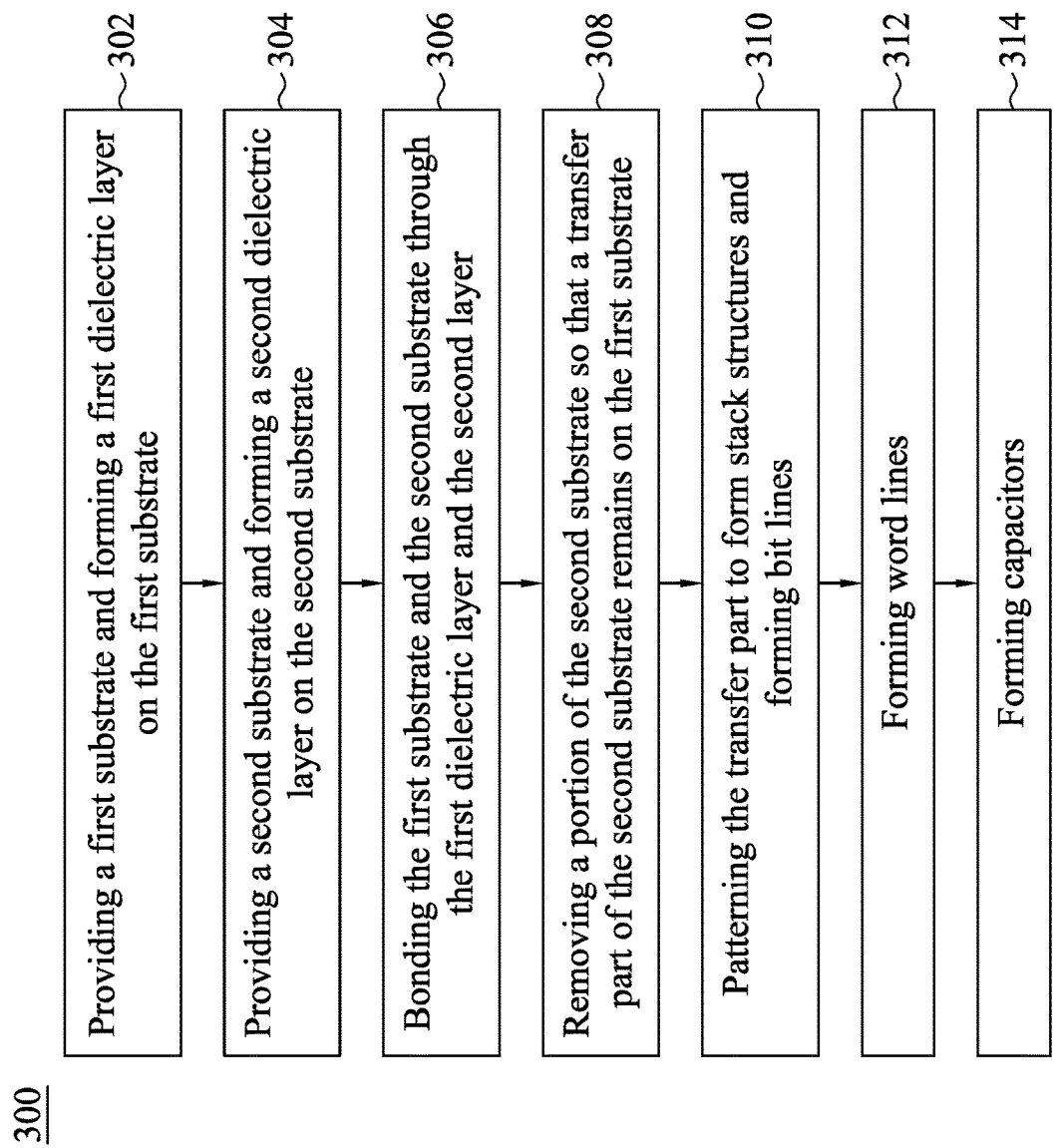
FIG. 4 is a flowchart illustrating a method of manufacturing a semiconductor device, in accordance with some embodiments of the present disclosure.

FIG. 4 is a flowchart illustrating a method 300 of manufacturing a semiconductor device, in accordance with some embodiments of the present disclosure.

The method 300 begins with operation 302, in which a first substrate is provided. A conductive feature may be formed on the first substrate. A first dielectric layer may be formed on the conductive feature.

The method 300 continues with operation 304 in which a second substrate may be provided. The second substrate may include a support part, a detach part, and a transfer part. The transfer part may include a plurality of doped regions. A metallization layer may be formed on the transfer part of the second substrate. A second dielectric layer may be formed on the metallization layer.

The method 300 continues with operation 306 in which the first substrate is bonded to the second substrate. The first substrate may be bonded to the second substrate by a fusion bonding technique. The first dielectric layer may be bonded to the second dielectric layer to form a bonding structure. A plurality of voids may be formed within the bonding structure.

The method 300 continues with operation 308 in which a portion of the second substrate is removed. The support part of the second substrate may be removed. The detach part of the second substrate may be removed. The transfer part may remain over the first substrate.

The method 300 continues with operation 310 in which the transfer part of the second substrate may be patterned to form stack structures. The metallization layer may be patterned to form bit lines.

The method 300 continues with operation 312 in which word lines may be formed on a respective lateral surface of each of the stack structures.

The method 300 continues with operation 314 in which capacitors may be formed over the stack structures, and a semiconductor device may be formed.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 4. In some embodiments, the method 300 can include one or more operations depicted in FIG. 4.

Figure 5A:
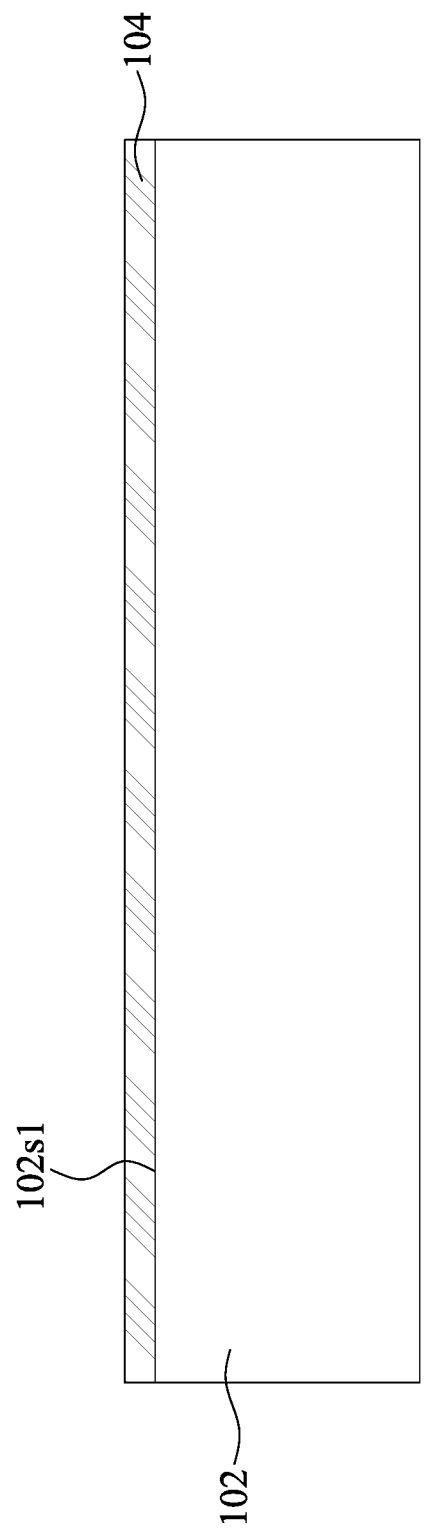
FIG. 5A illustrates one or more stages of an exemplary method for manufacturing a semiconductor device according to some embodiments of the present disclosure.

FIG. 5A to FIG. 5K illustrate one or more stages of an exemplary method for manufacturing a semiconductor device according to some embodiments of the present disclosure, Referring to FIG. 5A, a substrate 102 may be provided. In some embodiments, a conductive feature 104 may be formed on a surface 102s1 of the substrate 102. The conductive feature 104 may be formed by physical vapor deposition (PVD), chemical vapor deposition (CVD), atomic layer deposition (ALD), low-pressure chemical vapor deposition (LPCVD), or other suitable processes.

Figure 5B:
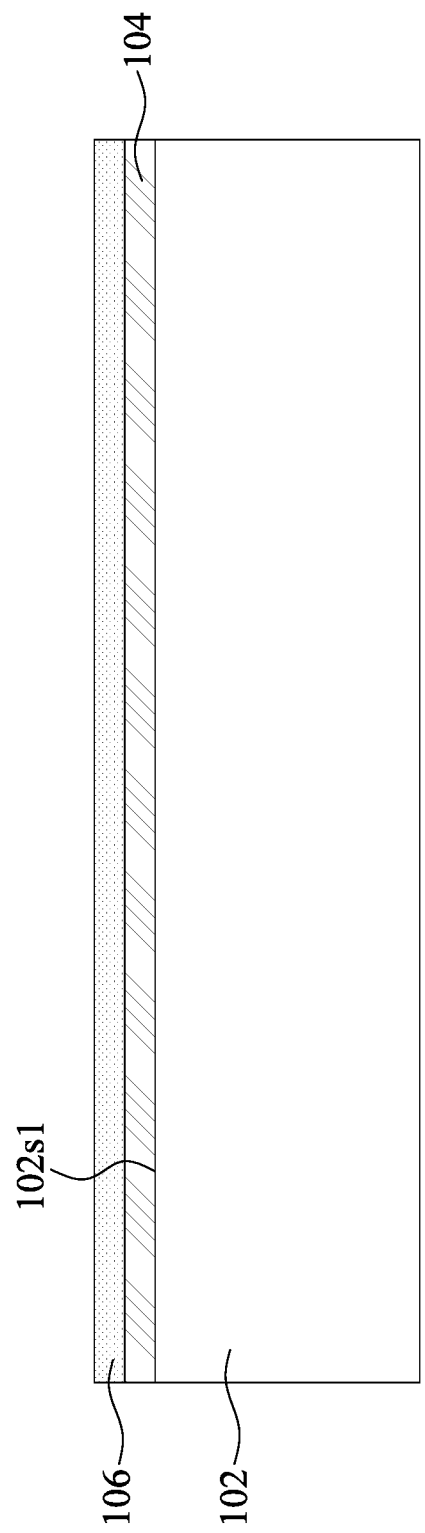
FIG. 5B illustrates one or more stages of an exemplary method for manufacturing a semiconductor device according to some embodiments of the present disclosure.

Referring to FIG. 5B, a dielectric layer 106 may be formed on the conductive feature 104. In some embodiments, the dielectric layer 106 may be formed by a deposition technique, such as CVD, ALD, LPCVD, or other suitable processes. In some embodiments, the dielectric layer 106 may include, for example, silicon oxide.

Figure 5C:
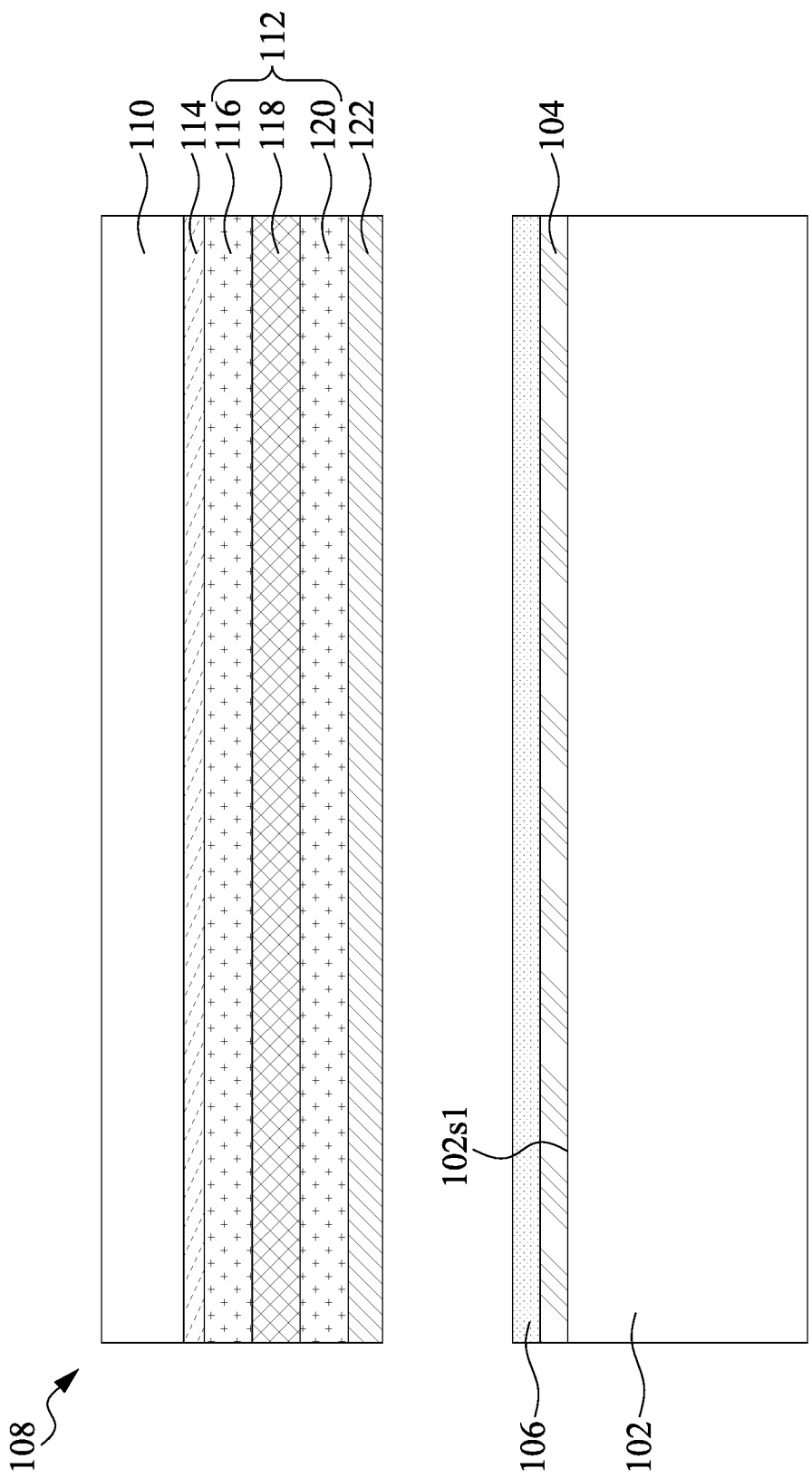
FIG. 5C illustrates one or more stages of an exemplary method for manufacturing a semiconductor device according to some embodiments of the present disclosure.

Referring to FIG. 5C, a substrate 108 may be provided. The substrate 108 may be a semiconductor substrate, such as a bulk semiconductor, a semiconductor-on-insulator (SOI) substrate, or the like. The substrate 108 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy.

The substrate 108 may include a support part 110, a transfer part 112, and a detach part 114. The detach part 114 may be formed between the support part 110 and the transfer part 112. In some embodiments, the detach part 114 may be formed by ion implantation to cause damage at the detach part 114. The dopants implanted may include hydrogen, oxygen, or other suitable dopants. The detach part 114 may also include one or more porous semiconductor material layers, a lattice mismatched layer, an etch stop layer, or combinations thereof.

In some embodiments, the transfer part 112 may include a doped region 116, a doped region 118, and a doped region 120. Each of the doped region 116 and the doped region 120 may have a first conductive type, such as n type. The doped region 118 may have a second conductive type, such as p type. Each of the doped region 116, the doped region 118, and the doped region 120 may be formed by ion implantation, diffusion, plasma doping, during deposition, or combinations thereof. In some embodiments, each of the doped region 116, the doped region 118, and the doped region 120 may be a part of the substrate 108, or each of the doped region 116, the doped region 118, and the doped region 120 may be a region subsequently grown over the detach part 114.

In some embodiments, a metallization layer 122 may be formed on the transfer part 112. The metallization layer 122 may be formed by, for example, PVD, CVD, ALD, LPCVD, or other suitable processes.

Figure 5D:
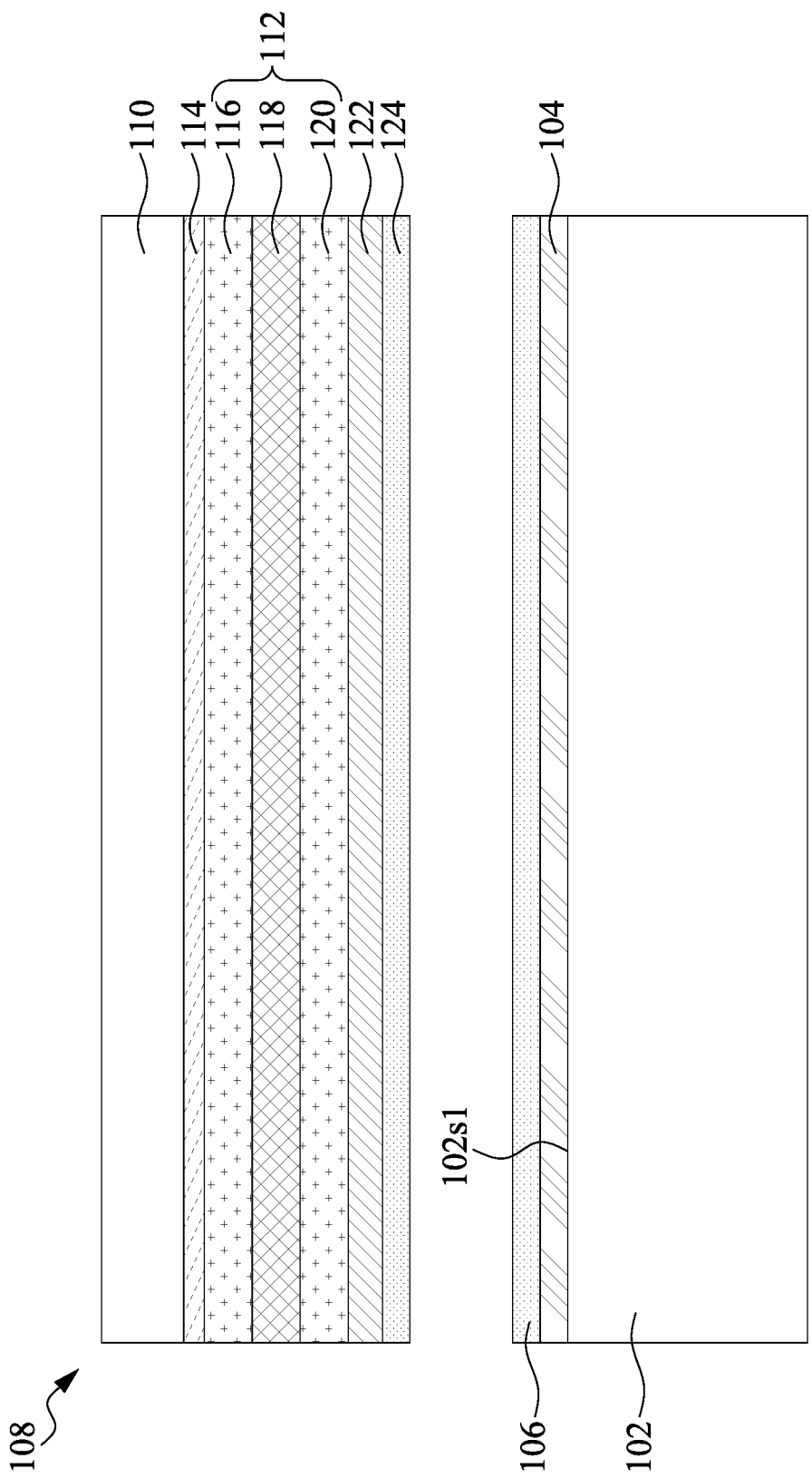
FIG. 5D illustrates one or more stages of an exemplary method for manufacturing a semiconductor device according to some embodiments of the present disclosure.

Referring to FIG. 5D, a dielectric layer 124 may be formed on the transfer part 112 of the substrate 108. In some embodiments, the dielectric layer 124 may be formed by a deposition technique, such as CVD, ALD, LPCVD, or other suitable processes. In some embodiments, the dielectric layer 124 may include, for example, silicon oxide.

Figure 5E:
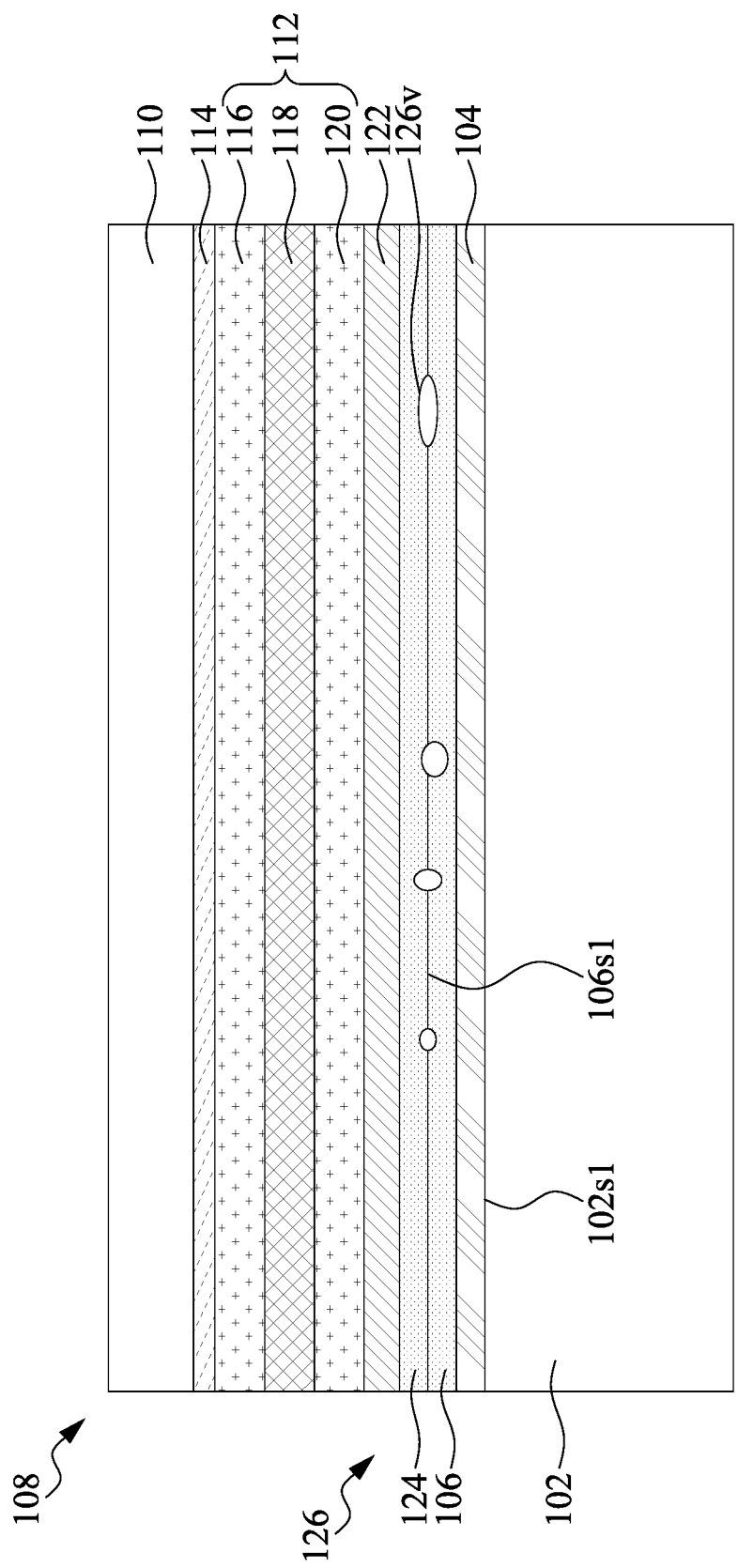
FIG. 5E illustrates one or more stages of an exemplary method for manufacturing a semiconductor device according to some embodiments of the present disclosure.

Referring to FIG. 5E, the substrate 102 may be bonded to the substrate 108. In some embodiments, the dielectric layer 106 may be bonded to the dielectric layer 124, thereby forming a bonding structure 126. In some embodiments, a fusion bonding technique is utilized to bond the dielectric layer 106 and the dielectric layer 124. In some embodiments, a plurality of voids 126v may be formed at the interface 106s1 between the dielectric layer 106 and the dielectric layer 124 when the fusion bonding technique is performed. The metallization layer 122 may be spaced apart from the conductive feature 104 by the bonding structure 126. In some embodiments, the fusion bonding technique may be performed at a temperature ranging from about 200° C. to about 300° C.

Figure 5F:
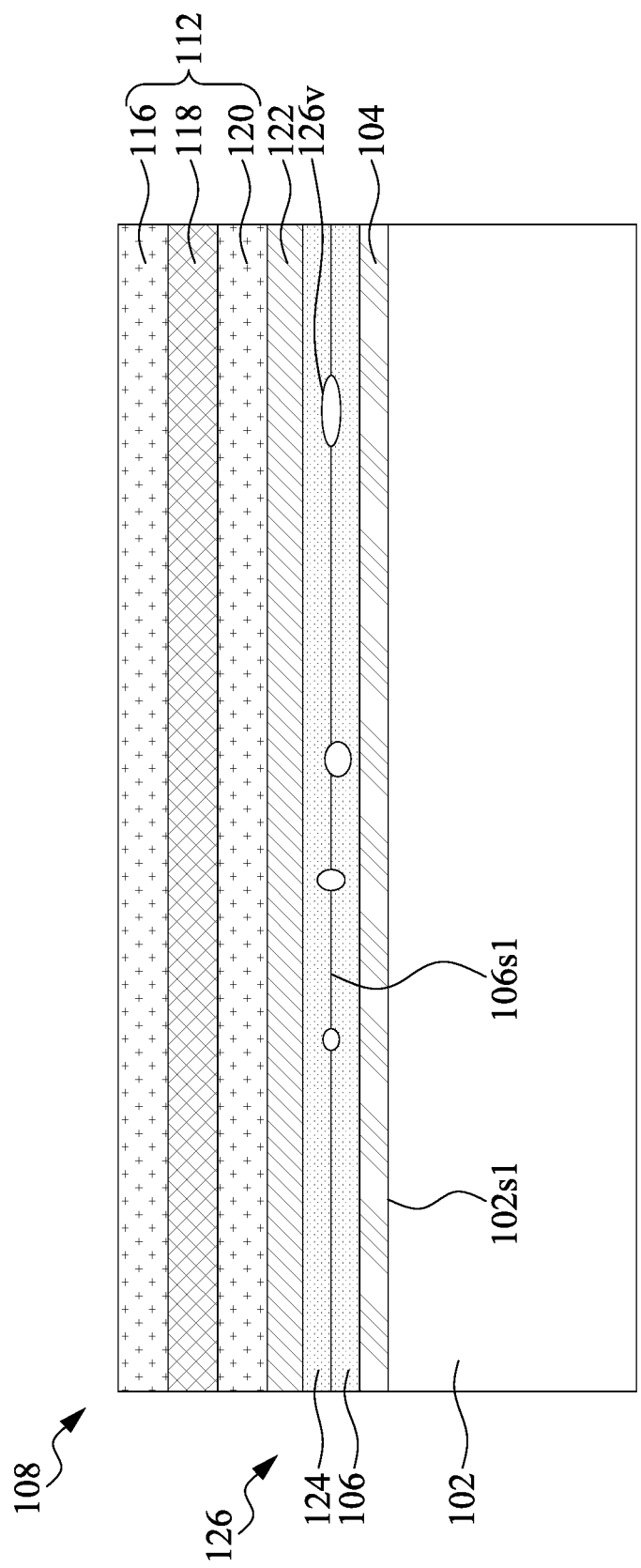
FIG. 5F illustrates one or more stages of an exemplary method for manufacturing a semiconductor device according to some embodiments of the present disclosure.

Referring to FIG. 5F, a portion of the substrate 108 may be removed. In some embodiments, the support part 110 of the substrate 108 may be removed. In some embodiments, the detach part 114 of the substrate 108 may be removed. In some embodiments, the transfer part 112 may remain over the substrate 102. In some embodiments, before the support part 110 is removed, a backside surface of the support part 110 may be polished.

Figure 5G:
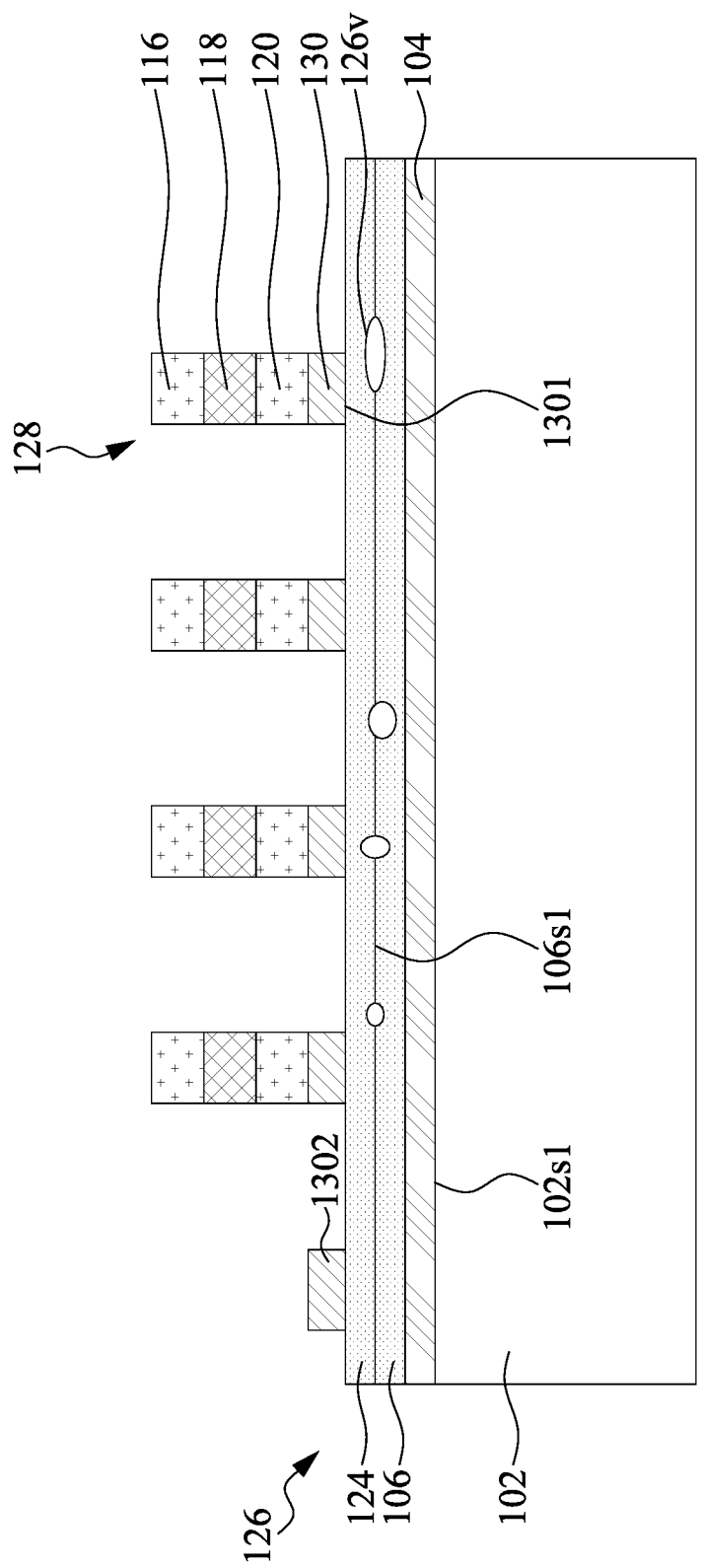
FIG. 5G illustrates one or more stages of an exemplary method for manufacturing a semiconductor device according to some embodiments of the present disclosure.

Referring to FIG. 5G, the transfer part 112 may be patterned to form a plurality of stack structures 128. In some embodiments, the metallization layer 122 may be patterned to form a plurality of bit lines 1301 and 1302. Although not shown in FIG. 5G, it should be noted that the transfer part 112 may be patterned by two etching processes so that the stack structure 128 may have a circular, an oval, or an elliptical profile. The metallization layer 122 may be patterned by one etching process so that each of the conductive lines 130 may have a striped profile. In some embodiments, one of the conductive lines 130 may be connected to a plurality of stack structures 128.

Figure 5H:
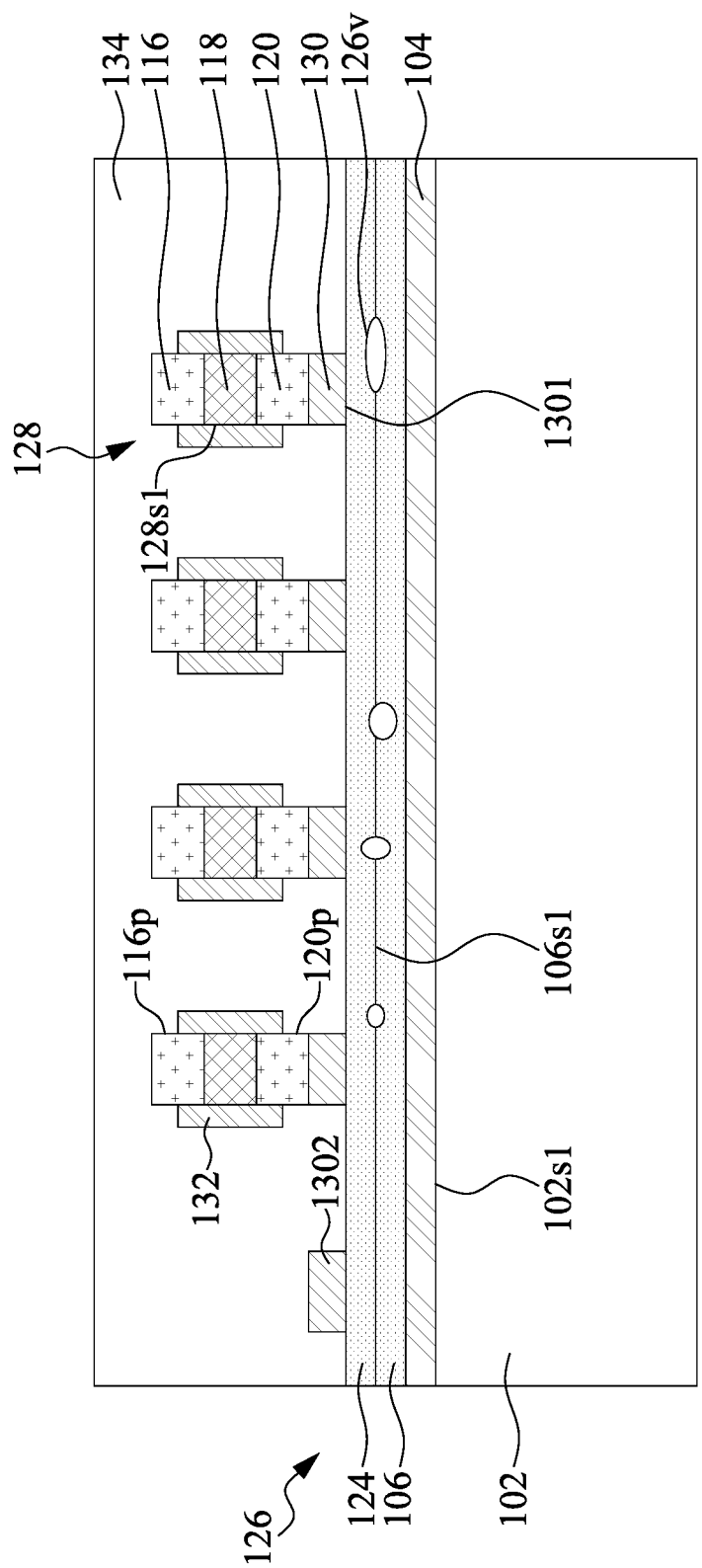
FIG. 5H illustrates one or more stages of an exemplary method for manufacturing a semiconductor device according to some embodiments of the present disclosure.

Referring to FIG. 5H, a word line 132 may be formed on a lateral surface 128s1 of the stack structure 128 to surround the stack structure 128. In some embodiments, a dielectric structure 134 may be formed to cover the word line 132, the stack structure 128, and the conductive line 130. In some embodiments, the dielectric structure 134 may include a multilayered structure. The word line 132 and the dielectric structure 134 may be formed by multiple processes. The word line 132 may be formed by, for example, PVD, CVD, ALD, LPCVD, or other suitable processes. The dielectric structure 134 may be formed by, for example, CVD, ALD, LPCVD, or other suitable processes.

Figure 5I:
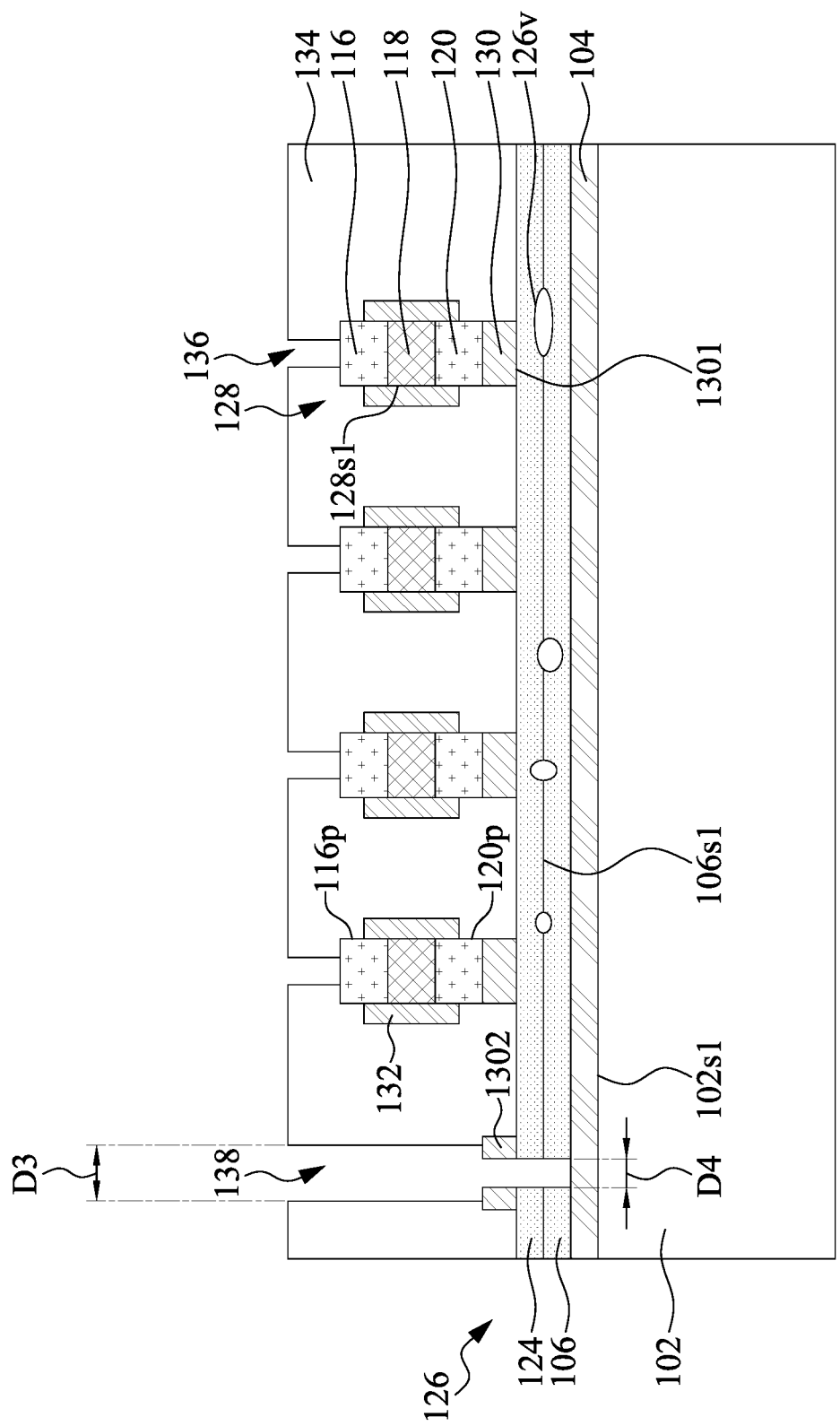
FIG. 5I illustrates one or more stages of an exemplary method for manufacturing a semiconductor device according to some embodiments of the present disclosure.

Referring to FIG. 5I, a portion of the dielectric structure 134 may be removed. In some embodiments, a plurality of openings 136 may be performed. In some embodiments, an opening 138 may be performed. Each of the openings 136 and 138 may be performed by a patterning technique. The patterning technique may include lithography, etching, or other suitable processes. The photolithography process may include photoresist coating (e.g., spin-on coating), soft baking, mask aligning, exposure, post-exposure baking, developing the photoresist, rinsing and drying (e.g., hard baking). The etching process may include, for example, dry or wet etching. The opening 136 may be located above stack structure 128. The opening 138 may penetrate the dielectric structure 134. The opening 138 may penetrate the bit line 1302. The opening 138 may penetrate the bonding structure 126. A portion of the conductive feature 104 may be exposed by the opening 138. The opening 138 may have a dimension D3 and a dimension D4 different from the dimension D3. The dimension D4 may be less than the dimension D3. The dimension D3 may be defined by the dielectric structure 134. The dimension D4 may be defined by the bonding structure 126.

Figure 5J:
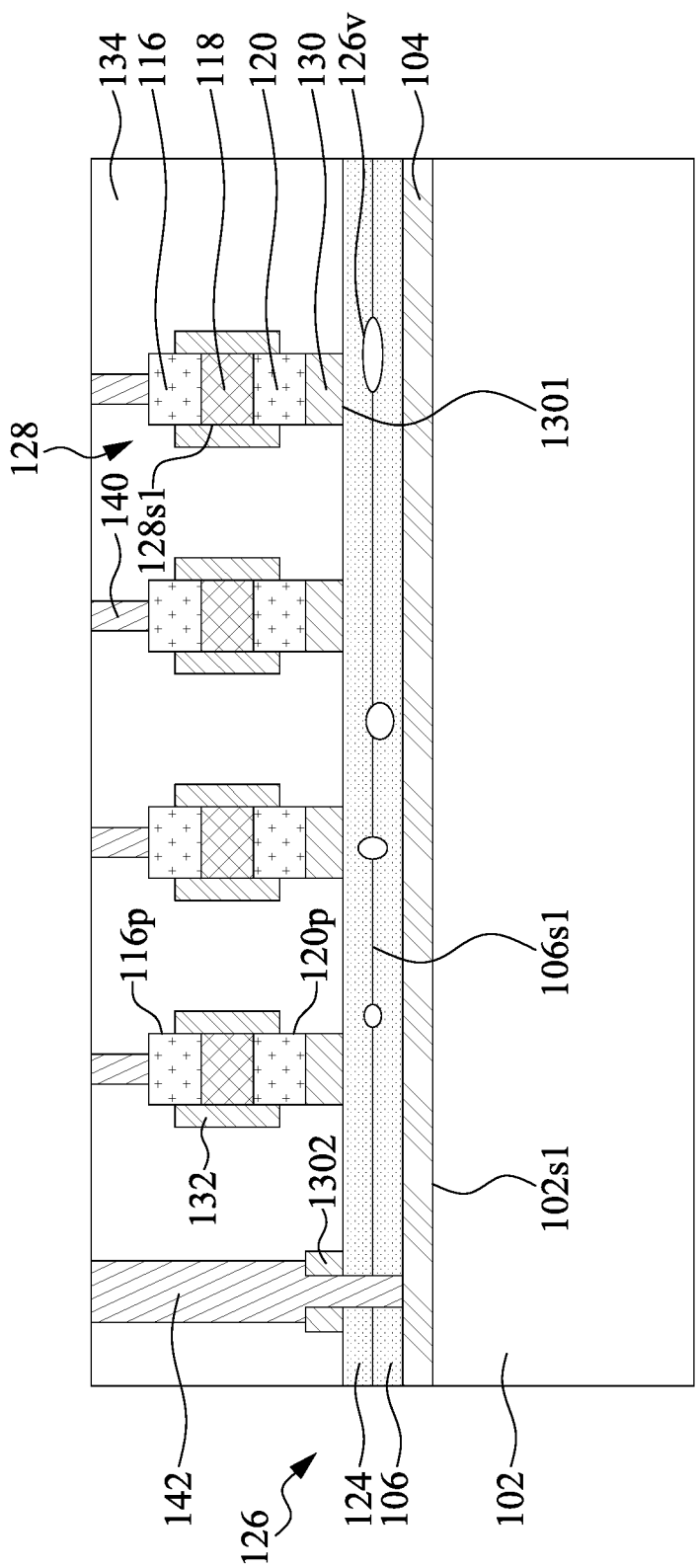
FIG. 5J illustrates one or more stages of an exemplary method for manufacturing a semiconductor device according to some embodiments of the present disclosure.

Referring to FIG. 5J, a conductive plug 140 may be formed to fill the opening 136. A conductive plug 142 may be formed to fill the opening 138. The conductive plug 142 may be electrically connected to the conductive feature 104. Each of the openings 136 and 138 may be formed by, for example, PVD, CVD, ALD, LPCVD, or other suitable processes.

Figure 5K:
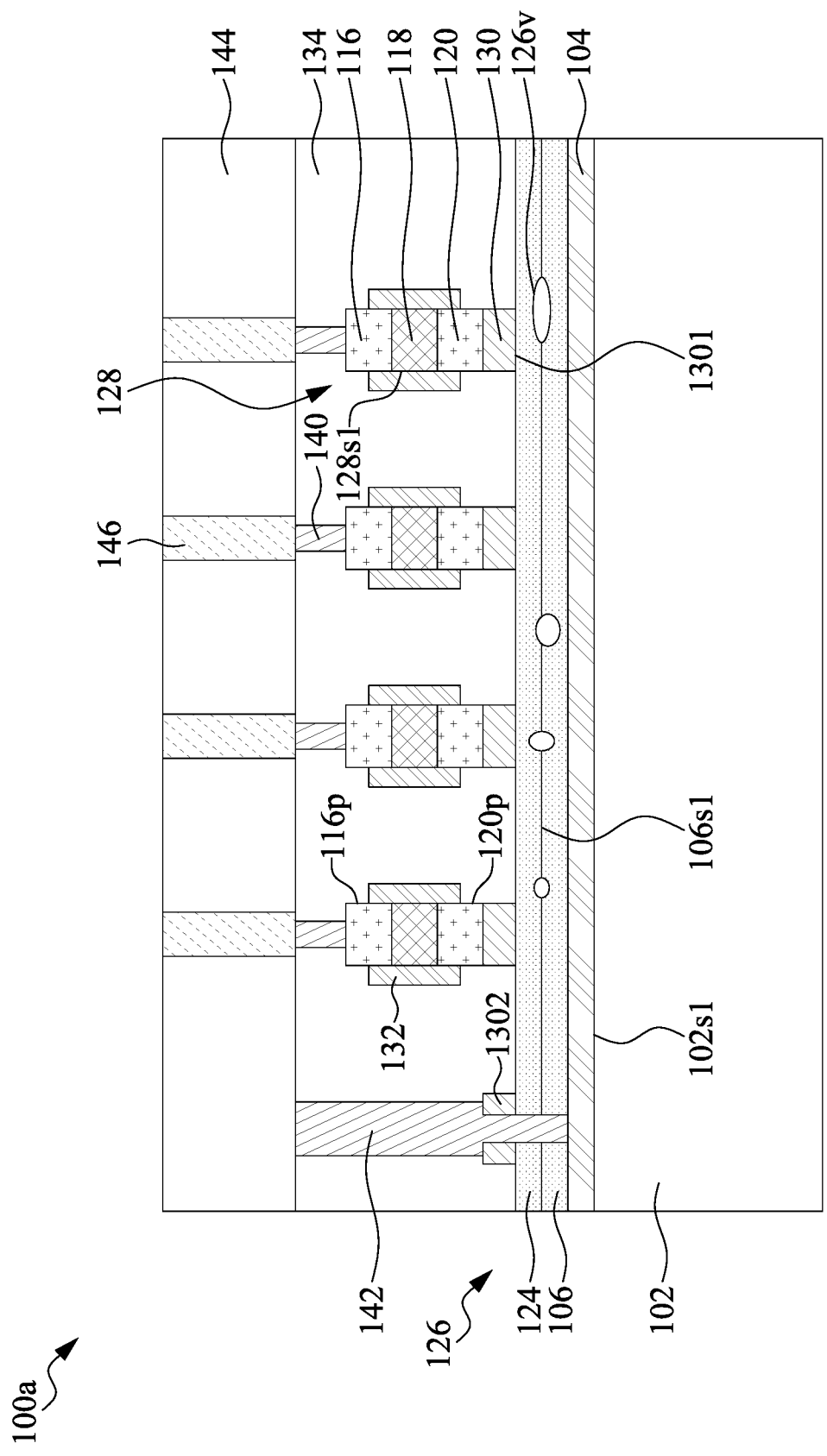
FIG. 5K illustrates one or more stages of an exemplary method for manufacturing a semiconductor device according to some embodiments of the present disclosure.

Referring to FIG. 5K, a dielectric structure 144 may be formed over the dielectric structure 134. In some embodiments, a plurality of capacitors 146 may be formed over the stack structure 128, and a semiconductor device, such as the semiconductor device 100a as shown in FIG. 1, may be produced. The dielectric structure 144 may be formed by, for example, CVD, PVD, ALD, LPCVD, or other suitable processes.

In this embodiment, the bonding structure 126 may be configured to bond the substrate 102 and the substrate 108. The substrate 102 and the substrate 108 may be bonded by a fusion bonding technique, which involves a bonding between two dielectric layers, such as silicon oxide. The fusion bonding technique may be performed at a relatively low temperature ranging from about 200° C. to about 300° C. In a comparative example, two substrates are bonded by bonding two metal layers, which is performed at a relatively high temperature ranging from about 600° C. to about 900° C. Such high temperature may damage transistors or other components and thus adversely affect the electrical properties of a semiconductor device. Further, no voids are formed in the conductive line 130 (e.g., bit line 1301) in the present disclosure. Therefore, the performance of the semiconductor device 100a may be enhanced.

Figure 6:
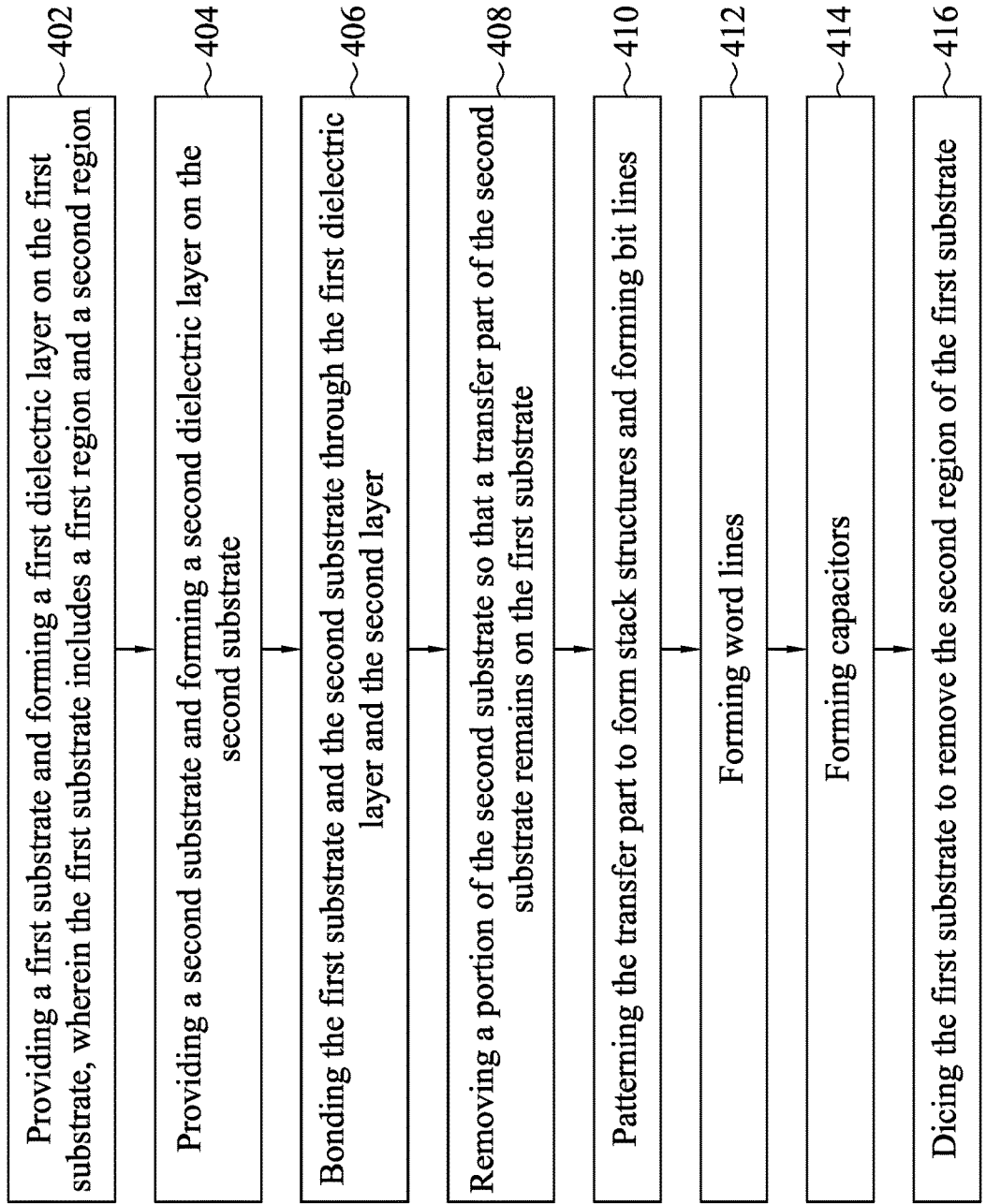
FIG. 6 is a flowchart illustrating a method of manufacturing a semiconductor device, in accordance with some embodiments of the present disclosure.

FIG. 6 is a flowchart illustrating a method 400 of manufacturing a semiconductor device, in accordance with some embodiments of the present disclosure.

The method 400 begins with operation 402, in which a first substrate is provided. A conductive feature may be formed on the first substrate. A first dielectric layer may be formed on the conductive feature. The first substrate may include a first region and a second region. The first region may be configured to form a semiconductor device. The second region may serve as a scribe line, which will be removed in a subsequent stage. Transistors may be formed over the first region of the first substrate. An alignment feature may be formed over the second region of the first substrate.

The method 400 continues with operation 404 in which a second substrate may be provided. The second substrate may include a support part, a detach part, and a transfer part. The transfer part may include a plurality of doped regions. A metallization layer may be formed on the transfer part of the second substrate. A second dielectric layer may be formed on the metallization layer.

The method 400 continues with operation 406 in which the first substrate is bonded to the second substrate. The first substrate may be bonded to the second substrate by a fusion bonding technique. The first dielectric layer may be bonded to the second dielectric layer to form a bonding structure. The alignment feature may be configured to align the first substrate and the second substrate when the fusion bonding technique is performed.

The method 400 continues with operation 408 in which a portion of the second substrate is removed. The support part of the second substrate may be removed. The detach part of the second substrate may be removed. The transfer part may remain over the first substrate.

The method 400 continues with operation 410 in which the transfer part of the second substrate may be patterned to form stack structures. The metallization layer may be patterned to form bit lines over the stack structures.

The method 400 continues with operation 412 in which word lines may be formed on a respective lateral surface of the stack structures.

The method 400 continues with operation 414 in which capacitors may be formed over the stack structures.

The method 400 continues with operation 416 in which the first substrate may be diced to form a plurality of semiconductor devices. The second region may be removed from the first region of the substrate.

The method 400 is merely an example, and is not intended to limit the present disclosure beyond what is explicitly recited in the claims. Additional operations can be provided before, during, or after each operation of the method 400, and some operations described can be replaced, eliminated, or reordered for additional embodiments of the method. In some embodiments, the method 400 can include further operations not depicted in FIG. 6. In some embodiments, the method 400 can include one or more operations depicted in FIG. 6.

Figure 7A:
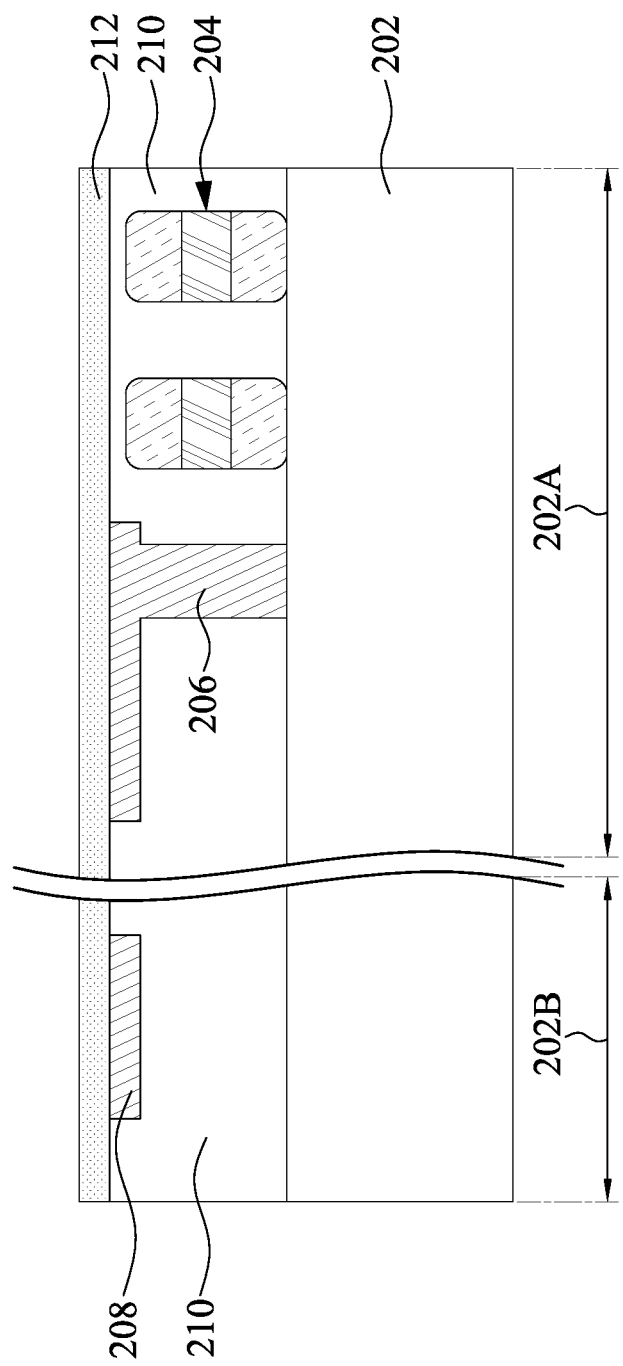
FIG. 7A illustrates one or more stages of an exemplary method for manufacturing a semiconductor device according to some embodiments of the present disclosure.

FIG. 7A to FIG. 7G illustrate one or more stages of an exemplary method for manufacturing a semiconductor device according to some embodiments of the present disclosure, Referring to FIG. 7A, a substrate 202 may be provided. In some embodiments, the substrate 202 may include a region 202A and a region 202B. The region 202A may be configured to form a semiconductor device, such as a DRAM or other suitable devices. The region 202B may serve as a scribe line. In some embodiments, a plurality of transistor 204 may be formed over the region 202A of the substrate 202. In some embodiments, a conductive feature 206 may be formed on the substrate 202. A dielectric structure 210 may be formed on the substrate 202. In some embodiments, an alignment feature 208 may be formed over the region 202B of the substrate 202. The alignment feature 208 may include a conductive material, such as tungsten, copper, aluminum, tantalum, tantalum nitride, titanium, titanium nitride, the like, and/or a combination thereof. In some embodiments, a dielectric layer 212 may be formed on the dielectric structure 210 to cover the conductive feature 206 and the alignment feature 208. In some embodiments, the dielectric layer 212 may be formed by CVD, ALD, LPCVD, or other suitable processes. In some embodiments, the dielectric layer 212 may include, for example, silicon oxide.

Figure 7B:
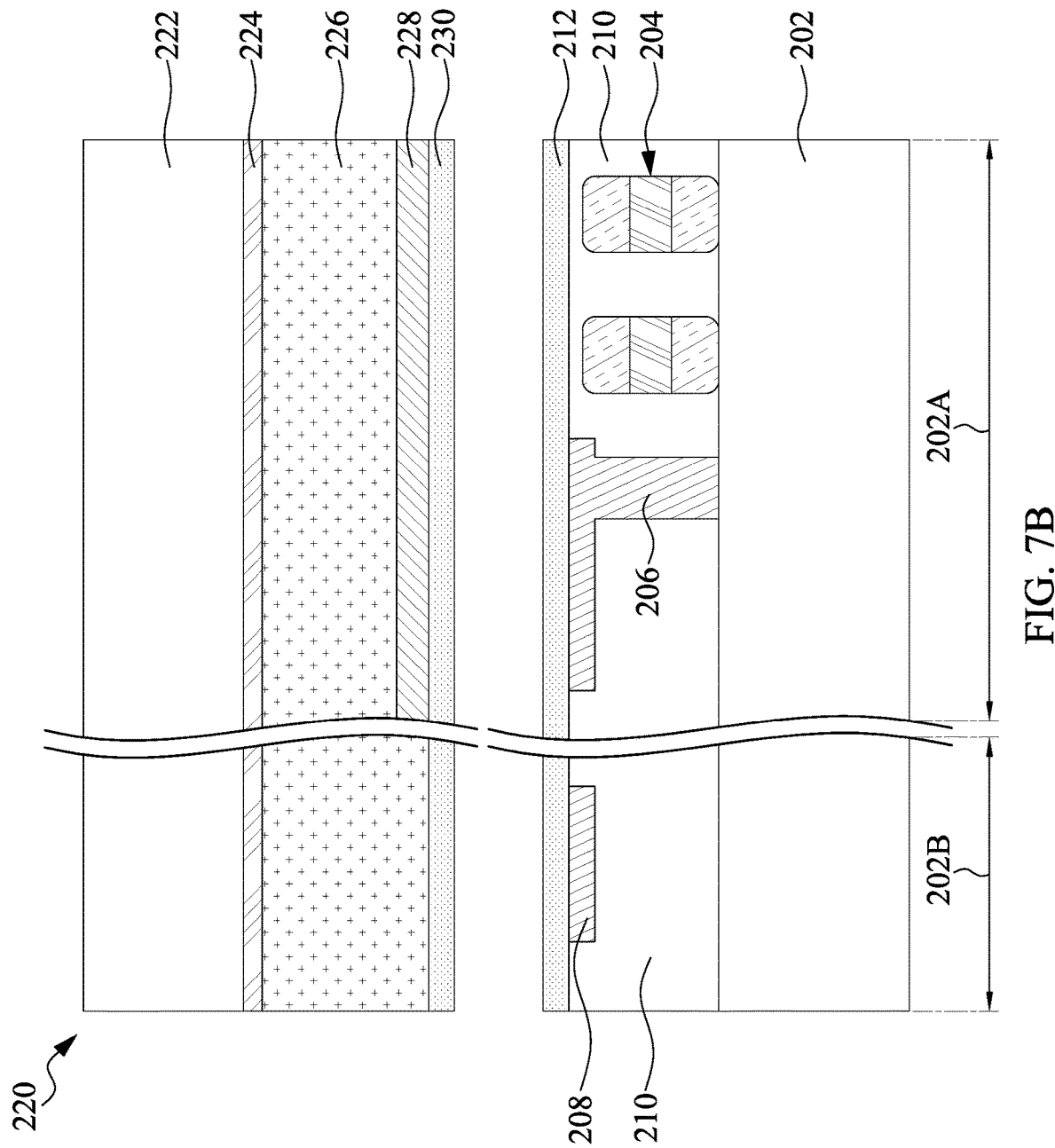
FIG. 7B illustrates one or more stages of an exemplary method for manufacturing a semiconductor device according to some embodiments of the present disclosure.

Referring to FIG. 7B, a substrate 220 may be provided. The substrate 220 may be a semiconductor substrate, such as a bulk semiconductor, a semiconductor-on-insulator substrate, or the like. The substrate 220 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 220 may include metal oxide.

The substrate 220 may include a support part 222, a detach part 224, and a transfer part 226. The detach part 224 may be formed between the support part 222 and the transfer part 226. In some embodiments, the detach part 224 may be formed by ion implantation to cause damage at the detach part 224. The dopants implanted may include hydrogen, oxygen, or other suitable dopants. The detach part 224 may also include one or more porous semiconductor material layers, a lattice mismatched layer, an etch stop layer, or combinations thereof. The transfer part 226 may include doped regions, which may include p type and/or n type dopants.

In some embodiments, a metallization layer 228 may be formed on the transfer part 226. The metallization layer 228 may be formed by, for example, PVD, CVD, ALD, LPCVD, or other suitable processes.

In some embodiments, a dielectric layer 230 may be formed on the transfer part 226 and the metallization layer 228. In some embodiments, the dielectric layer 230 may be formed by CVD, ALD, LPCVD, or other suitable processes. In some embodiments, the dielectric layer 230 may include, for example, silicon oxide.

Figure 7C:
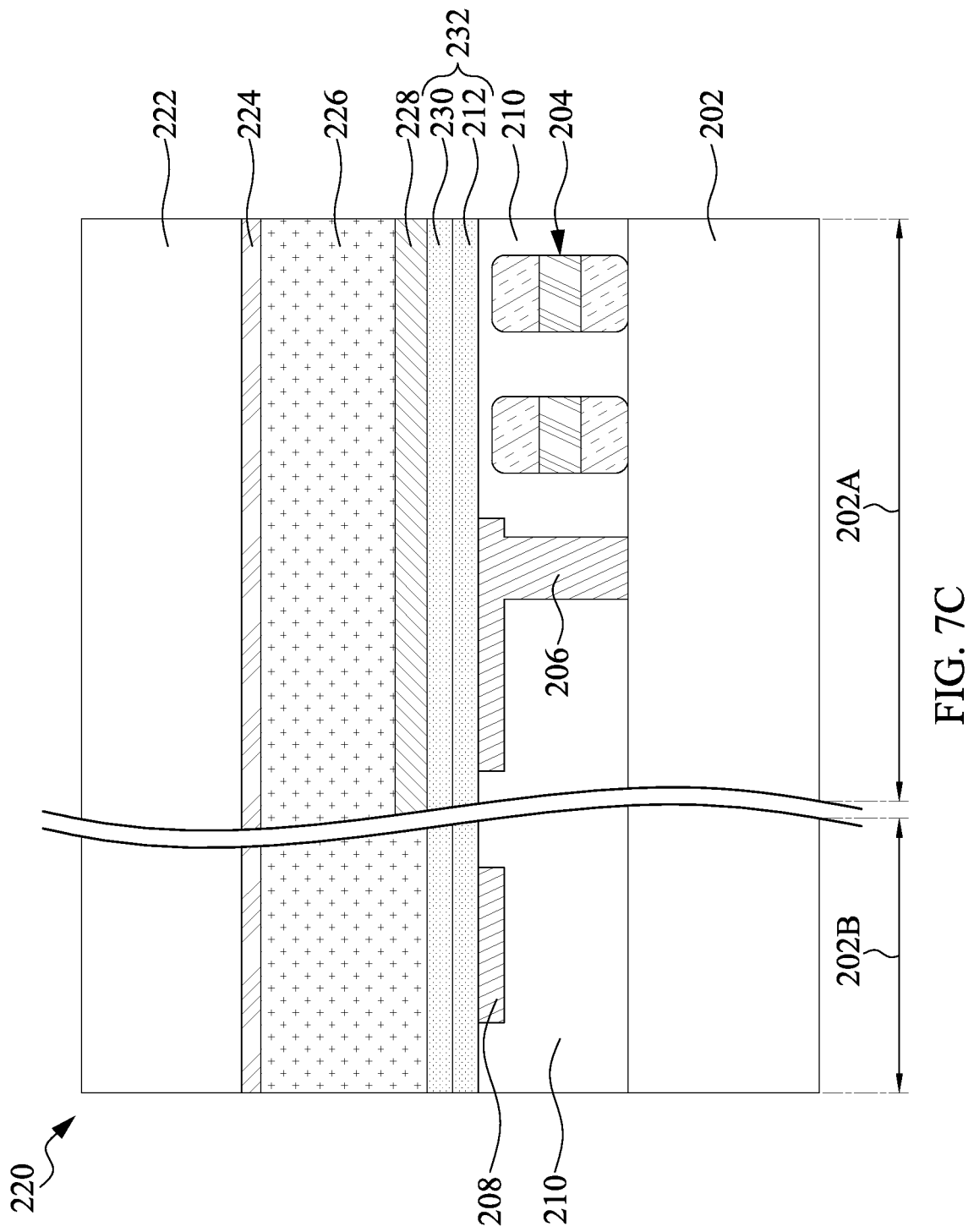
FIG. 7C illustrates one or more stages of an exemplary method for manufacturing a semiconductor device according to some embodiments of the present disclosure.

Referring to FIG. 7C, the substrate 220 may be bonded to the substrate 202. In some embodiments, the dielectric layer 230 may be bonded to the dielectric layer 212, thereby forming a bonding structure 232. In some embodiments, a fusion bonding technique is utilized to bond the dielectric layer 230 and the dielectric layer 212. In some embodiments, a plurality of voids (not shown) may be formed when the fusion bonding technique is performed. In some embodiments, the fusion bonding technique may be performed at a temperature ranging from about 200° C. to about 300° C. In some embodiments, the alignment feature 208 may be configured to align the substrate 202 and the substrate 220 when the fusion bonding technique is performed.

Figure 7D:
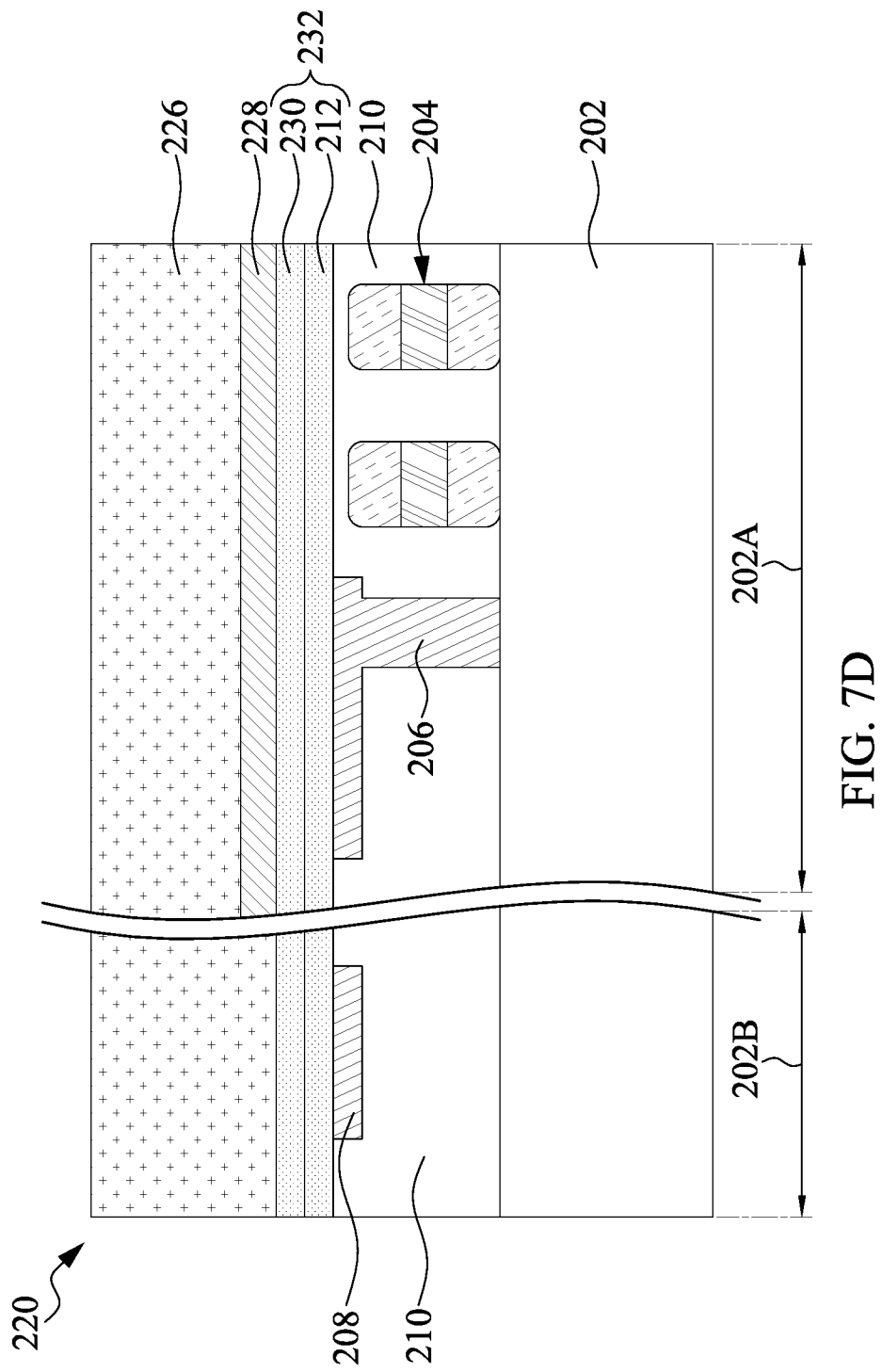
FIG. 7D illustrates one or more stages of an exemplary method for manufacturing a semiconductor device according to some embodiments of the present disclosure.

Referring to FIG. 7D, a portion of the substrate 220 may be removed. In some embodiments, the support part 222 of the substrate 220 may be removed. In some embodiments, the detach part 224 of the substrate 220 may be removed. In some embodiments, the transfer part 226 may remain over the substrate 202.

Figure 7E:
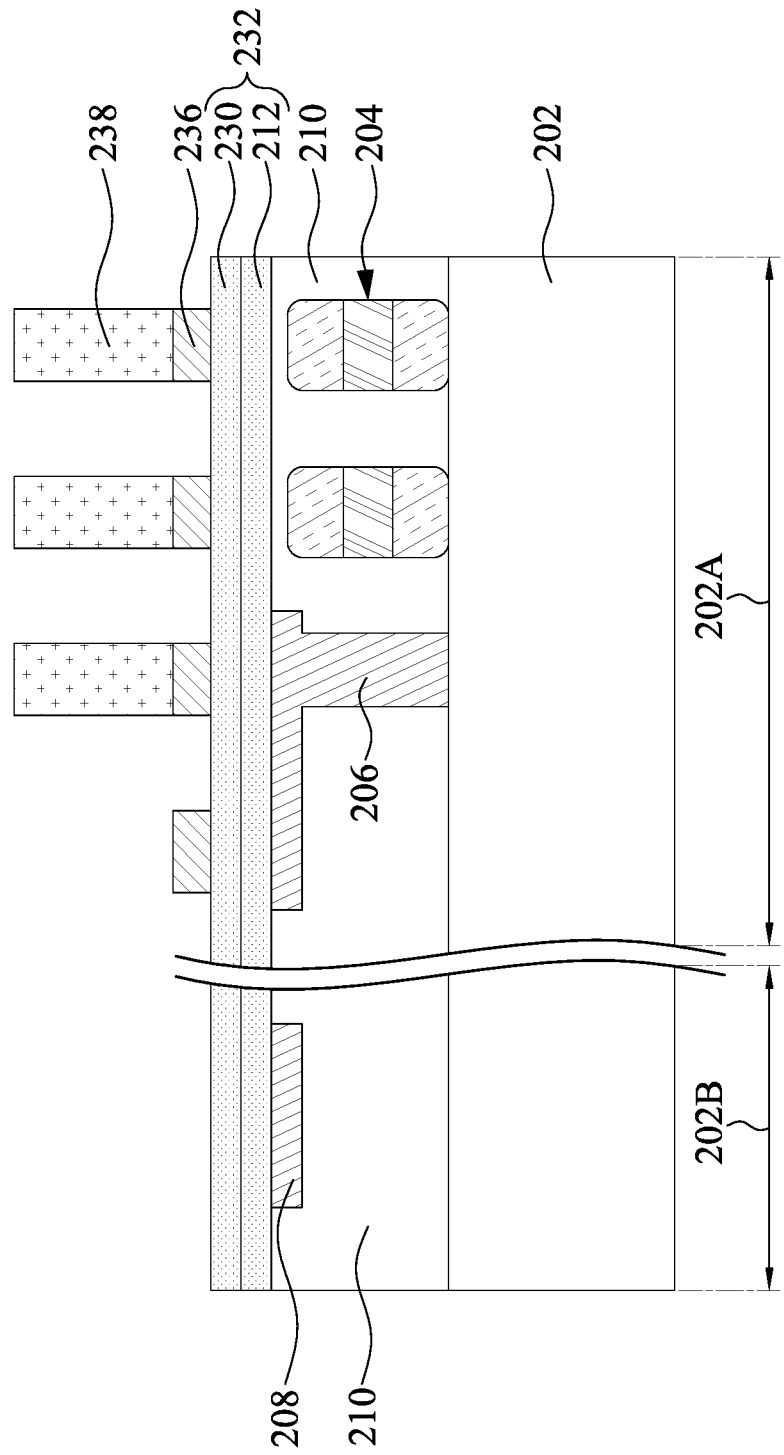
FIG. 7E illustrates one or more stages of an exemplary method for manufacturing a semiconductor device according to some embodiments of the present disclosure.

Referring to FIG. 7E, the transfer part 226 may be patterned to form a plurality of stack structures 238. In some embodiments, the metallization layer 228 may be patterned to form a plurality of conductive lines 236. In some embodiments, the transfer part 226 over the region 202B of the substrate 202 may be removed.

Figure 7F:
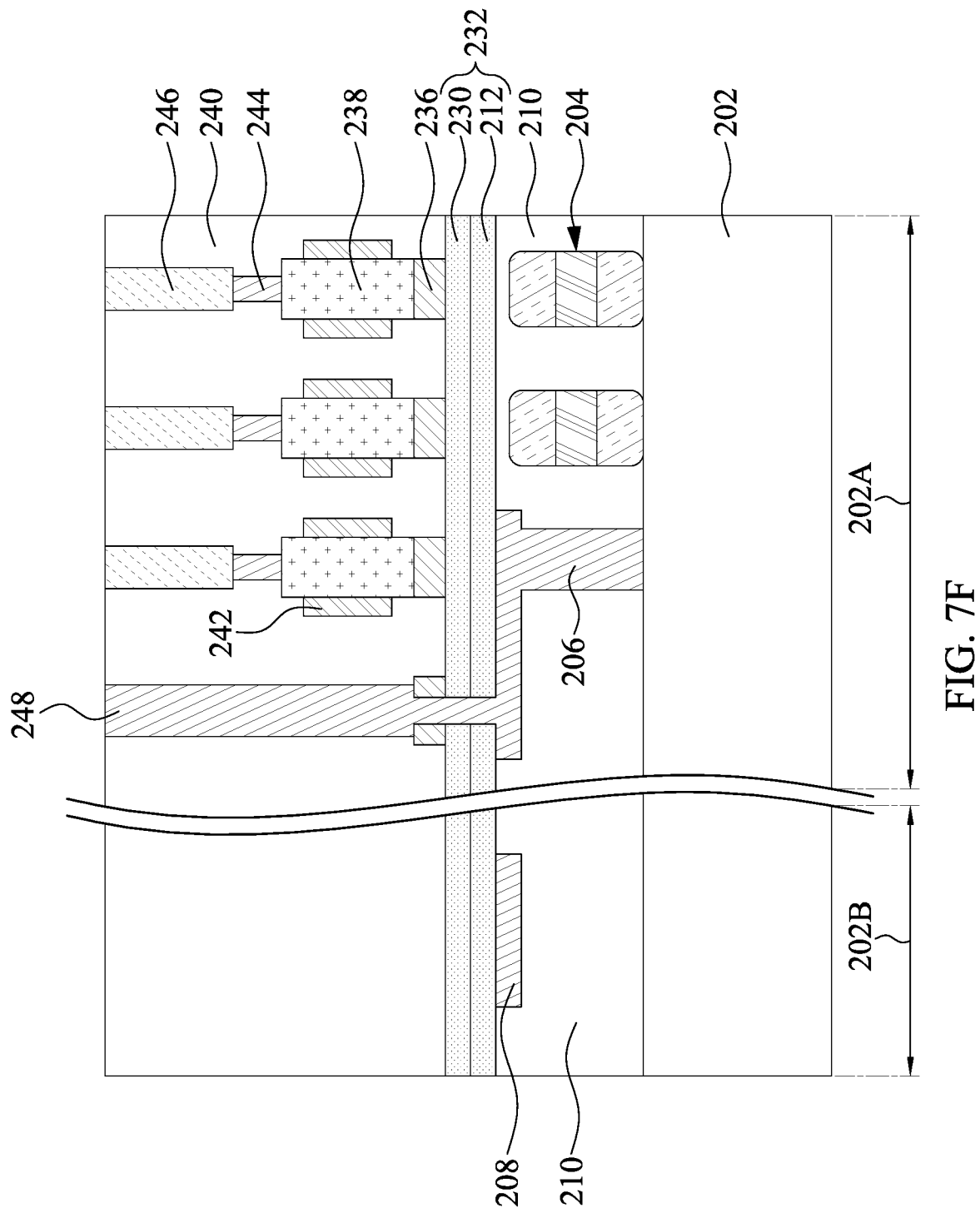
FIG. 7F illustrates one or more stages of an exemplary method for manufacturing a semiconductor device according to some embodiments of the present disclosure.

Referring to FIG. 7F, a word line 242 may be formed on a lateral surface of the stack structure 238. In some embodiments, a conductive plug 244 may be formed over the stack structure 238. In some embodiments, a capacitor 246 may be formed over the conductive plug 244. In some embodiments, a conductive plug 248 may be formed to be in contact with the conductive feature 206. A dielectric structure 240 may be formed to cover the bonding structure 232.

Figure 7G:
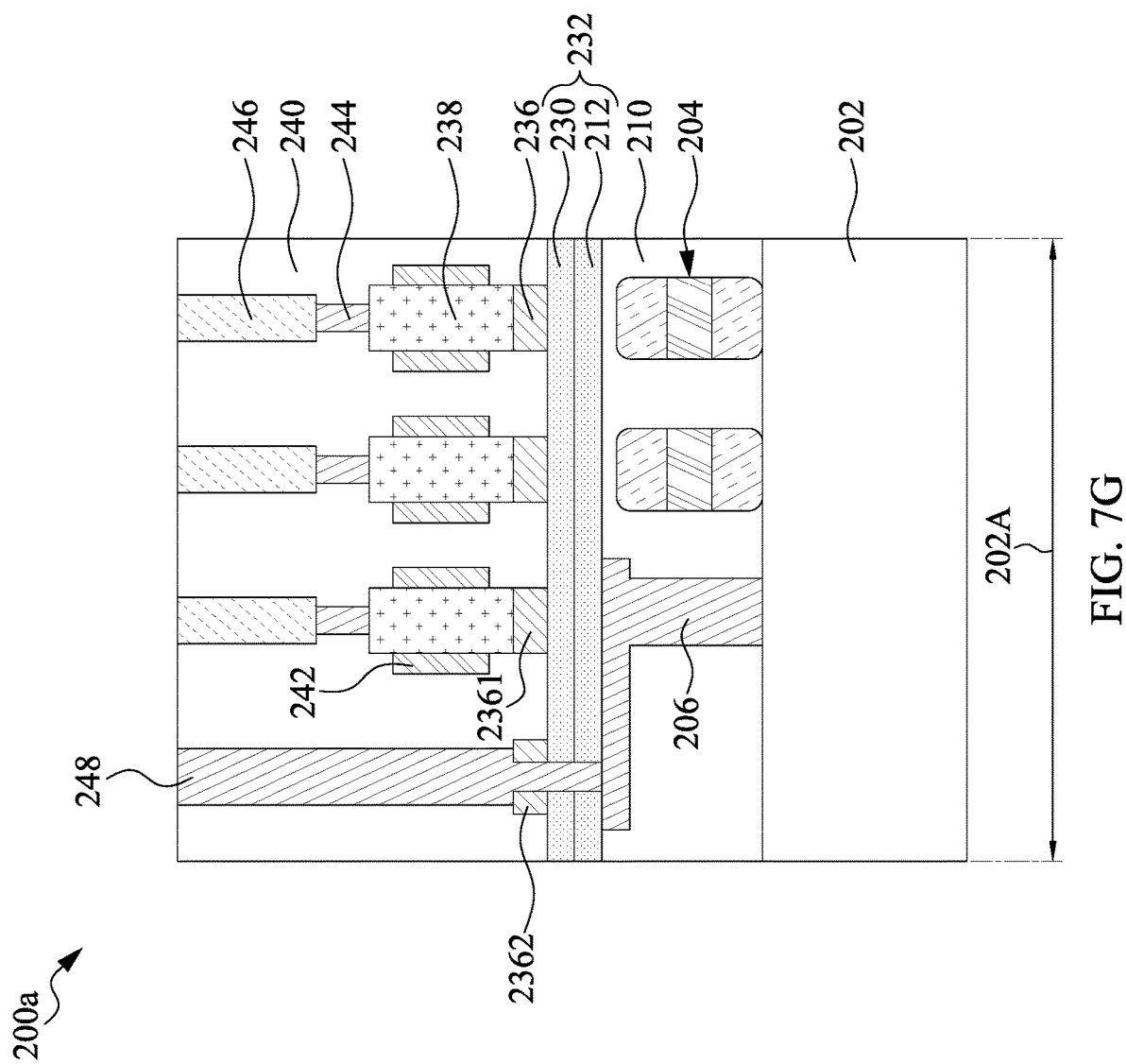
FIG. 7G illustrates one or more stages of an exemplary method for manufacturing a semiconductor device according to some embodiments of the present disclosure.

Referring to FIG. 7G, the substrate 202 may be diced to form a plurality of semiconductor device 200a. The region 202B may be separated from the region 202A. The alignment feature 208 may be removed.

In this embodiment, the substrate 220 and the substrate 202 may be bonded by a fusion bonding technique, which involves a bonding between two dielectric layers, such as silicon oxide layers. The fusion bonding technique may be performed at a relatively low temperature ranging from about 200° C. to about 300° C. In a comparative example, two substrates are bonded by bonding two metal layers, which is performed at a relatively high temperature ranging from about 600° C. to about 900° C. Such high temperature may damage transistors or other components and thus adversely affect the electrical properties of a semiconductor device. Further, no voids are formed in the conductive line 236. Therefore, the performance of the semiconductor device 200a may be enhanced.

One aspect of the present disclosure provides a semiconductor device. The semiconductor device includes a substrate, a bonding structure, a bit line, and a word line. The bonding structure is disposed on the substrate. The bit line is disposed on the bonding structure. The channel layer is disposed on the bit line. The word line surrounds the channel layer. The bonding structure comprises a dielectric material.

Another aspect of the present disclosure provides a method for manufacturing a semiconductor device. The method includes providing a first substrate and forming a first dielectric layer on the first substrate. The method also includes providing a second substrate, the second substrate including a metallization layer over the second substrate. The method further includes forming a second dielectric layer over the metallization layer. In addition, the method includes bonding the first dielectric layer and the second dielectric layer to form a bonding structure between the first substrate and the second substrate. The method also includes patterning the second substrate to form a stack structure over the bonding structure. The method further includes patterning the metallization layer to form a bit line over the bonding structure and forming a word line on a lateral surface of the stack structure.

Another aspect of the present disclosure provides a method for manufacturing a semiconductor device. The method includes providing a first substrate and forming a conductive feature over the first substrate. The method also includes forming a first dielectric layer on the conductive feature. The method further includes providing a second substrate. The second substrate includes a support part and a transfer part. In addition, the method includes forming a metallization layer on the transfer part of the second substrate and forming a second dielectric layer on the metallization layer. The method also includes bonding the first dielectric layer and the second dielectric layer and removing the support part of the second substrate. The method further includes patterning the transfer part of the second substrate to form a channel layer. Moreover, the method also includes patterning the metallization layer to form a bit line and forming a word line surrounding the channel layer.

The embodiments of the present disclosure provide a semiconductor device and method of manufacturing the same. During bonding of two substrates, a fusion bonding technique is utilized. Fusion bonding technique involves bonding two dielectric layers formed on two individual substrates. In a comparative example, two substrates are bonded through a bonding of metal to metal, resulting in voids formed at an interface between metal layers. Such voids may make a bit line, formed by patterning the metal layers, unstable, incurring a low yield. In the embodiments of the present disclosure, voids are formed at an interface between bonded dielectric layers. The void in the dielectric layer has a relatively dimension. Further, the bit lines of the present disclosure are free of voids, enhancing the yield in comparison with comparative examples.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   providing a first substrate;
   forming a first dielectric layer on the first substrate;
   providing a second substrate, the second substrate comprising a metallization layer over the second substrate; forming a second dielectric layer over the metallization layer;
   bonding the first dielectric layer and the second dielectric layer to form a bonding structure between the first substrate and the second substrate;
   patterning the second substrate to form a stackstructure over the bonding structure; patterning the metallization layer to form a bit line over the bonding structure; and
   forming a word line on a lateral surface of the stack structure; wherein a conductive feature is formed on the first substrate, and the first dielectric layer is formed on the conductive feature, and wherein the conductive feature is spaced apart from the bit line by the bonding structure.

2. The method of claim 1, wherein the second substrate comprises a support part and a transfer part, and the method further comprises removing the support part from the transfer part after the bonding structure is formed.

3. The method of claim 2, wherein the transfer part of the second substrate comprises a first doped region with a first conductive type and a second doped region with a second conductive type different from the first conductive type.

4. The method of claim 3, wherein a portion of the first doped region is exposed by the word line, and the second doped region is completely covered by the word line.

5. The method of claim 1, wherein the first dielectric layer is formed by a deposition technique.

6. The method of claim 1, wherein the second dielectric layer is formed by a deposition technique.

7. The method of claim 1, wherein an alignment feature is formed over the first substrate, and the alignment feature is configured to align the first substrate and the second substrate when bonding the first dielectric layer and the second dielectric layer.

8. The method of claim 7, further comprising:
   dicing the first substrate to remove the alignment feature.

9. A method of manufacturing a semiconductor device, comprising:
   providing a first substrate;
   forming a conductive feature over the first substrate;
   forming a first dielectric layer on the conductive feature;
   providing a second substrate, the second substrate comprising a support part and a transfer part;
   forming a metallization layer on the transfer part of the second substrate;
   forming a second dielectric layer on the metallization layer;
   bonding the first dielectric layer and the second dielectric layer;
   removing the support part of the second substrate;
   patterning the transfer part of the second substrate to form a channel layer;
   patterning the metallization layer to form a bit line; and
   forming a word line surrounding the channel layer;
   wherein the second substrate further comprises a detach part between the support part and the transfer part, and the method further comprises removing the detach part of the second substrate.

10. The method of claim 9, wherein an alignment feature is formed over the first substrate, and the alignment feature is configured to align the first substrate and the second substrate when bonding the first dielectric layer and the second dielectric layer.

11. The method of claim 10, wherein patterning the transfer part of the second substrate comprises removing the transfer part over the alignment feature.

12. The method of claim 9, further comprising forming a capacitor over the channel layer.

13. The method of claim 9, further comprising forming a conductive plug penetrating the first dielectric layer and the second dielectric layer.

* * * * *